United States Patent
Okumura et al.

(10) Patent No.: US 8,624,481 B2
(45) Date of Patent: Jan. 7, 2014

(54) DISPLAY PANEL AND DISPLAY PANEL MANUFACTURING METHOD

(75) Inventors: Hiroko Okumura, Osaka (JP); Hiroyuki Masuda, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/609,558

(22) Filed: Sep. 11, 2012

(65) Prior Publication Data

US 2013/0026907 A1 Jan. 31, 2013

Related U.S. Application Data

(63) Continuation of application No. PCT/JP2011/003768, filed on Jun. 30, 2011.

(51) Int. Cl.
*H01J 1/62* (2006.01)

(52) U.S. Cl.
USPC .................. 313/498; 313/506; 313/512

(58) Field of Classification Search
USPC ............................. 313/498, 506, 512
See application file for complete search history.

(56) References Cited

U.S. PATENT DOCUMENTS

| 5,443,922 A | 8/1995 | Nishizaki et al. |
| 2006/0135029 A1 | 6/2006 | Harada |

FOREIGN PATENT DOCUMENTS

| JP | 05-163488 | 6/1993 |
| JP | 2005-293946 | 10/2005 |
| JP | 2006-196429 | 7/2006 |
| JP | 2006-227296 | 8/2006 |
| JP | 2007-095611 | 4/2007 |
| JP | 2007-103027 | 4/2007 |
| JP | 2007-165214 | 6/2007 |
| JP | 2008-112001 | 5/2008 |
| JP | 2009-271470 | 11/2009 |
| JP | 2010-244694 | 10/2010 |

OTHER PUBLICATIONS

Search report from P.C.T., mail date is Aug. 2, 2011.

*Primary Examiner* — Vip Patel
(74) *Attorney, Agent, or Firm* — Greenblum & Bernstein, P.L.C.

(57) ABSTRACT

A display panel enabling constraint of void formation between substrates and minimizing the effect of any voids formed, has for at least one pixel, a distance between the element surface and the element opposing surface corresponding to each light-emitting element of the pixel that is smaller than a distance between the inter-pixel surface and the inter-pixel opposing surface in an inter-pixel area between neighboring pixels, and smaller than a distance between the inter-element surface and the inter-element opposing surface corresponding to the light-emitting elements, and on the element substrate, the distance between neighboring pixels is greater than a distance between neighboring light-emitting elements, and a distance between the inter-pixel surface and the inter-pixel opposing surface is greater than a maximum distance between the inter-element surface and the inter-element opposing surface.

13 Claims, 26 Drawing Sheets

CF Substrate Types [μm]

| CF Constituent \ Level | 1 | 2 | 3 |
|---|---|---|---|
| R | 1.0 | 1.8 | 2.5 |
| G | 1.0 | 1.8 | 2.5 |
| B | 1.62 | 1.8 | 2.5 |
| BM | 1.3 | 1.3 | 1.0 |

Distance Between EL Substrate and CF Substrate [μm]

| Level | 1 | 2 | 3 |
|---|---|---|---|
| D1 (R) | 11.60 | 10.80 | 10.00 |
| D1 (G) | 11.60 | 10.80 | 10.00 |
| D1 (B) | 10.98 | 10.80 | 10.00 |
| D2 | 11.30 | 11.30 | 10.50 |

D1<D2<D3

D2<D1<D3

D2<D3=D1

D2<D3<D1

FIG. 24
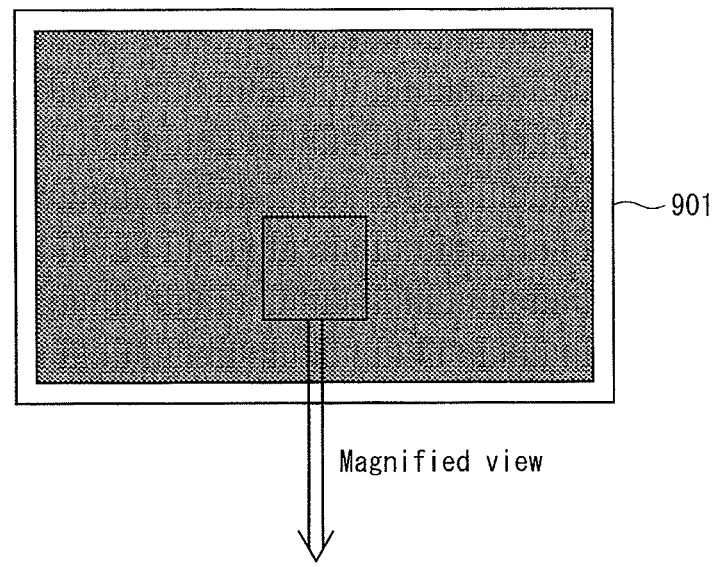
Magnified view
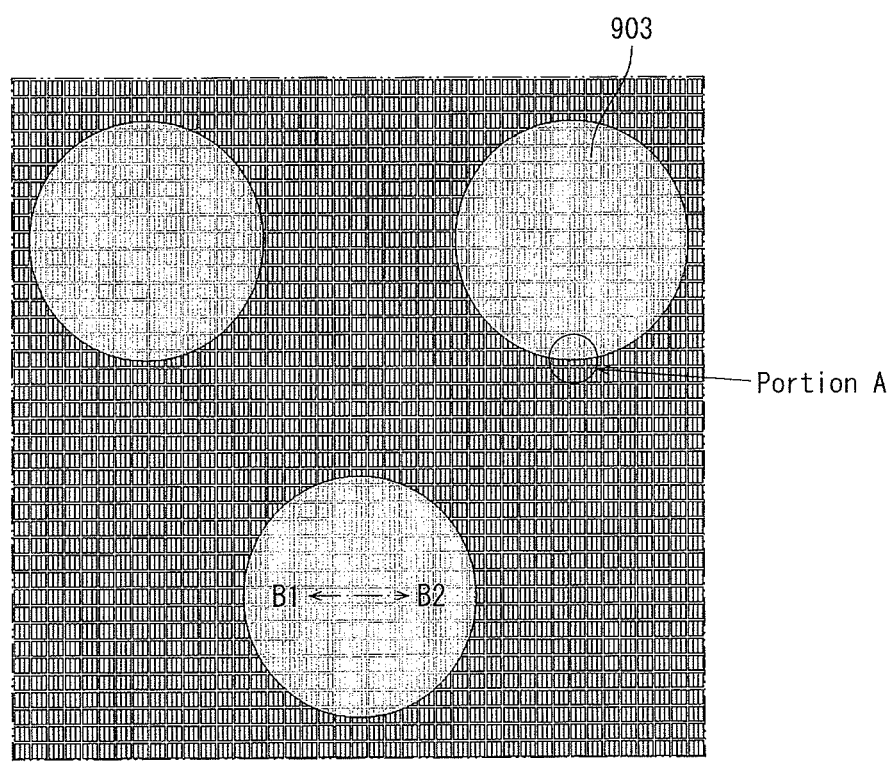

Magnification of portion A

DISPLAY PANEL AND DISPLAY PANEL MANUFACTURING METHOD

CROSS REFERENCE TO RELATED APPLICATION

This is a continuation application of PCT Application No. PCT/JP2011/003768 filed Jun. 30, 2011, designating the United States of America, the disclosure of which, including the specification, drawings and claims, is incorporated herein by reference in its entirety.

TECHNICAL FIELD

The present disclosure pertains to a display panel in which a sealing resin layer is interposed between an element substrate and an opposing substrate.

DESCRIPTION OF THE RELATED ART

Conventional technology allows for a sealing resin layer provided in order to prevent deterioration of a light-emitting element, such as an organic electroluminescence element, caused by the infiltration of water or oxygen from the outside atmosphere. That is, the sealing resin layer is formed between an element substrate, on which the light-emitting element is formed, and an opposing substrate (e.g., a CF substrate) opposite the element substrate.

The following describes a forming method for the sealing resin layer.

FIG. 24 is a schematic diagram illustrating resin flow during sealing resin layer formation. FIG. 25 is a magnified view of portion A of FIG. 24. FIG. 26 is a cross-section taken along line B1-B2 of FIG. 24. FIG. 27 is a schematic view illustrating the spread of the resin material.

The sealing resin layer is formed, for example, by dropping resin material 903, used for sealing, onto the opposing substrate 901. The dropping of the resin material 903 is performed by dripping a drop of the resin material 903 at a plurality of positions on the opposing substrate 901, in volumes sufficient for a single drop to cover multiple (e.g., on the order of 100) light-emitting elements.

Next, curing is initiated for the resin material 903 so dropped onto the opposing substrate 901. The curing of the resin material 903 is initiated, for example, by UV irradiation. The curing duration is controllable by the adjustment of curing delay agents, polymerization initiators, and reactants.

Subsequently, before the dropped resin material 903 hardens, the element substrate is arranged opposite the opposing substrate, and the two substrates are joined. Here, as shown in FIGS. 24-26, the dropped resin material 24 spreads in concentric circles, expanding from the center of each drip position.

As a result, as shown in FIG. 27, resin material 903a, spread in concentric circles from the center of a given drip position, mutually overlaps resin material 903b and 903c, similarly spread in concentric circles from the respective centers of neighbouring drip positions. Thus, the sealing resin layer forms over a wide area between the opposing substrate 901 and the element substrate.

CITATION LIST

[Patent Literature]
[Patent Literature 1]
Japanese Patent Application Publication No. 2010-244694 (FIG. 4)

[Patent Literature 2]
Japanese Patent Application Publication No. 2008-112001
[Patent Literature 3]
Japanese Patent Application Publication No. 2006-227296

SUMMARY

However, the above-described technology is problematic in that voids 905 remain in the sealing resin layer, wherever unfilled by the resin material. When such a void 905 occurs on or above one of the light-emitting elements, the light-emitting element remains uncovered by the sealing resin layer. This is problematic in that the light-emitting element is not protected against the deterioration caused by infiltration of water or oxygen from the outside atmosphere.

One non-limiting and exemplary Embodiment provides a display panel in which void formation is constrained, and in which the effect of void formation on the light-emitting elements is minimized, as well as a manufacturing method for such a display panel.

In one general aspect, the techniques disclosed here feature a display panel, comprising: an element substrate having a plurality of pixels, each pixel having at least one light-emitting element; an opposing substrate arranged so as to oppose the element substrate; and a sealing resin layer interposed between and adjoining the element substrate and the opposing substrate, respective surfaces of the element substrate and the opposing substrate facing each other, and the sealing layer sealing the light-emitting elements, wherein an element surface is defined as a top surface of the element substrate on one of the light-emitting elements, an element opposed surface is defined as a surface of the opposing substrate opposite the element surface, an inter-pixel surface is defined as a top surface of the element substrate between neighbouring pixels, an inter-pixel opposing surface is defined as a top surface of the opposing substrate opposite the inter-pixel surface, an inter-element surface is defined as a surface of the element substrate between neighbouring light-emitting elements within one of the pixels, an inter-element opposing surface is defined as a surface of the opposing substrate opposite the inter-element surface, for at least one given pixel, a distance between the element surface and the element opposing surface corresponding to each of the light-emitting elements of the given pixel is smaller than: a distance between the inter-pixel surface and the inter-pixel opposing surface in an inter-pixel area between the given pixel and at least one neighbouring pixel; and a distance between the inter-element surface and the inter-element opposing surface corresponding to the light-emitting elements of the given pixel, and on the element substrate, the distance between the given pixel and the neighbouring pixel is greater than a distance between one of the light-emitting elements of the given pixel and a neighbouring light-emitting element of the given pixel, and a distance between the inter-pixel surface and the inter-pixel opposing surface in an expansion is greater than a maximum distance between the inter-element surface and the inter-element opposing surface, the expansion being located between the given pixel and the neighbouring pixel.

In another general aspect, the techniques here disclosed feature a display panel manufacturing method, comprising: an element substrate formation step of forming an element substrate having a plurality of pixels, each pixel having at least one light-emitting element; an opposing substrate formation step of forming an opposing substrate arranged so as to oppose the element substrate; and a sealing resin layer formation step of forming a sealing resin layer, respective surfaces of the element substrate formed in the element substrate formation step and the opposing substrate formed in the opposing substrate formation step facing each other, the sealing resin layer being interposed between and adjoining the element substrate and the opposing substrate, and the resin layer sealing the light-emitting elements, wherein for the element substrate formation step and the opposing substrate formation step, an element surface is defined as a region of the surface of the element substrate on one of the light-emitting elements, an element opposing surface is defined as a surface of the opposing substrate opposite the element surface, an inter-pixel surface is defined as a surface of the element substrate between neighbouring pixels, an inter-pixel opposing surface is defined as a region of the surface of the opposing substrate opposite the inter-pixel surface, an inter-element surface is defined as a surface of the element substrate between neighbouring light-emitting elements within one of the pixels, an inter-element opposing surface is defined as a surface of the opposing substrate opposite the inter-element surface, and the element substrate and the opposing substrate are formed such that: on the element substrate, for at least one given pixel, a distance between the element surface and the element opposing surface corresponding to each of the light-emitting elements of the given pixel is smaller than: a distance between the inter-element surface and the inter-element opposing surface in an inter-pixel area between the given pixel and at least one neighbouring pixel; and a distance between the inter-element surface and the inter-element opposing surface corresponding to the light-emitting elements of the given pixel, and on the element substrate, the distance between the given pixel and the neighbouring pixel is greater than a distance between one of the light-emitting elements of the given pixel and a neighbouring light-emitting element of the given pixel, and a distance in an expansion between the inter-pixel surface and the inter-pixel opposing surface is greater than a maximum distance between the inter-element surface and the inter-element opposing surface, the expansion being located between the given pixel and the neighbouring pixel.

According to the above structure, the distance between the element substrate and the opposing substrate is wider at portions where none of the light-emitting elements are formed than at portions where the light-emitting elements are formed. Thus, the distance between the element substrate and the opposing substrate is narrower at portions where the light-emitting elements are formed, such that the fluidity of the resin material is increased at such portions and thereby constraining void formation in the portions where the light-emitting elements are formed.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 15A illustrates irregularities of the EL substrate and the CF substrate, and FIG. 15B illustrates the distance between the EL substrate and the CF substrate.

FIG. 17A is given using level 3 of the CF substrate, and FIG. 17B is given using level 1 of the CF substrate.

FIG. 18A is given using level 3 of the CF substrate, and FIG. 18B is given using level 1 of the CF substrate.

FIG. 24 is a schematic diagram illustrating resin flow during sealing resin layer formation.

DETAILED DESCRIPTION

Overview of Embodiments

Figure 1:
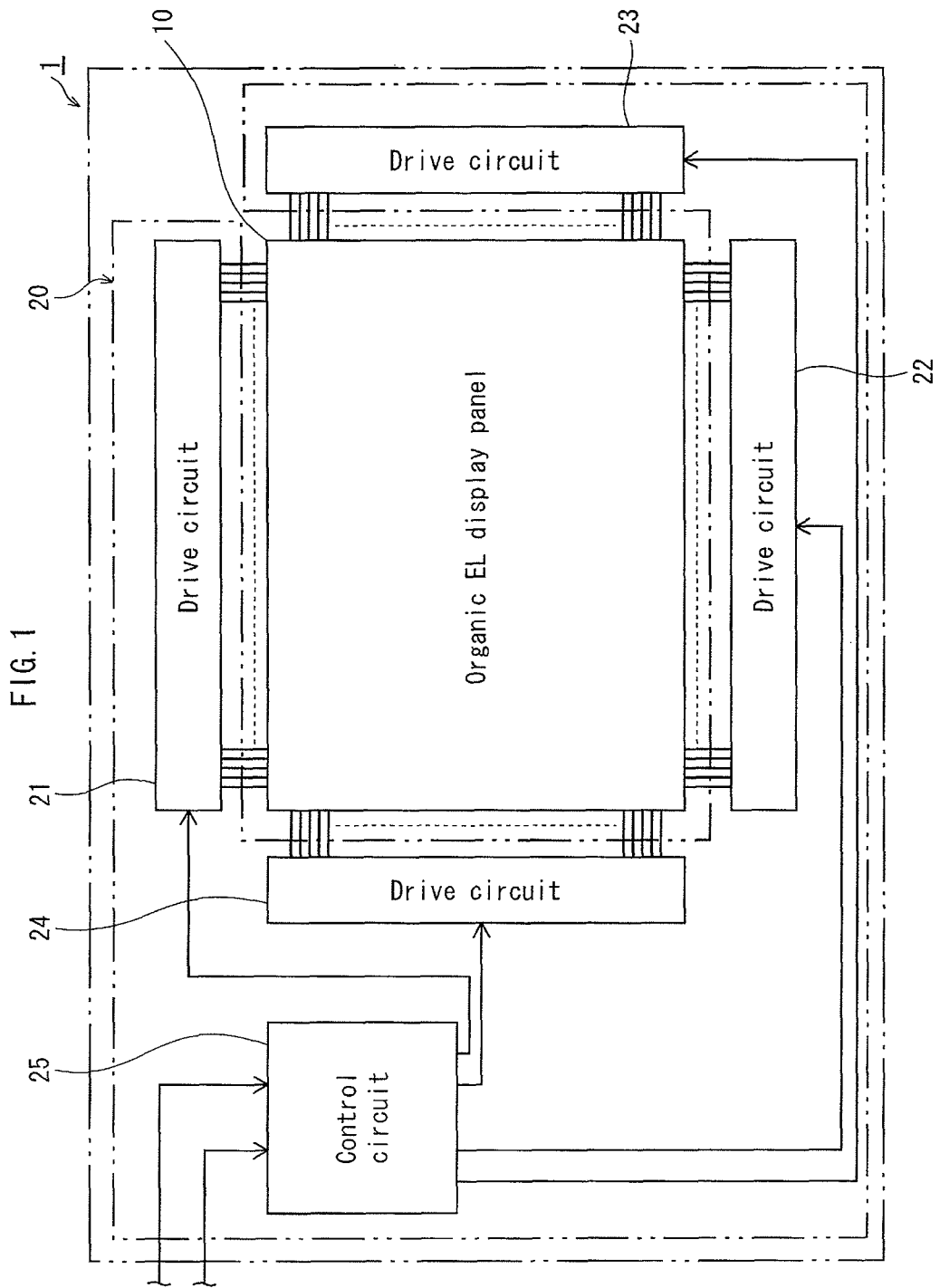
FIG. 1 is a block diagram schematically representing the overall configuration of a display device.

In one non-limiting aspect, a display panel of the present disclosure comprises: an element substrate having a plurality of pixels, each pixel having at least one light-emitting element; an opposing substrate arranged so as to oppose the element substrate; and a sealing resin layer interposed between and adjoining the element substrate and the opposing substrate, respective surfaces of the element substrate and the opposing substrate facing each other, and sealing the light-emitting elements, wherein an element surface is defined as a top surface of the element substrate on one of the light-emitting elements, an element opposing surface is defined a surface of the opposing substrate opposite the element surface, an inter-pixel surface is defined as a top surface of the element substrate between neighbouring pixels, an inter-pixel opposing surface is defined as a surface of the opposing substrate opposite the inter-pixel surface, an inter-element surface is defined as a top surface of the element substrate between neighbouring light-emitting elements within one of the pixels, an inter-element opposing surface is defined as a surface of the opposing substrate opposite the inter-element surface, for at least one given pixel, a distance between the element surface and the element opposing surface corresponding to each of the light-emitting elements of the given pixel is smaller than: a distance between the inter-pixel surface and the inter-pixel opposing surface in an inter-pixel area between the given pixel and at least one neighbouring pixel; and a distance between the inter-element surface and the inter-element opposing surface corresponding to the light-emitting elements of the given pixel, and on the element substrate, the distance between the given pixel and the neighbouring pixel is greater than a distance between one of the light-emitting elements of the given pixel and a neighbouring light-emitting element of the given pixel, and a distance between the inter-pixel surface and the inter-pixel opposing surface in an expansion is greater than a maximum distance between the inter-element surface and the inter-element opposing surface, the expansion being located between the given pixel and the neighbouring pixel.

In another non-limiting aspect of the display panel of the present disclosure, an element substrate reference surface is defined as a surface of the element substrate located on the inter-pixel area and nearest the opposing substrate, the element substrate has primary recesses (or primary concavities) each located on one of the light-emitting elements and recessed with respect to the element substrate reference surface, a bottom of each primary concavity being the element surface and the element substrate reference surface being the inter-pixel surface, an opposing substrate reference surface is defined as a surface of the opposing substrate opposite the element substrate reference surface, and the opposing substrate has primary protrusions each located opposite one of the primary concavities and protruding from the opposing substrate reference surface, a top face of each primary protrusion being the element opposing surface and the opposing substrate reference surface being the inter-pixel opposing surface.

Accordingly, a distance between the element surface and the element opposing surface, where the light-emitting elements are formed, is narrower than a distance between the inter-pixel surface and the inter-pixel opposing surface in an inter-pixel area between the given pixel and at least one neighbouring pixel, in inter-pixel areas where no light-emitting elements are formed. Thus, the fluidity of the resin material is increased where the light-emitting elements are formed, thereby constraining void formation in the vicinity of the light-emitting elements.

Conversely, the distance between the inter-pixel surface and the inter-pixel opposing surface in an inter-pixel area where no light-emitting elements are formed between the given pixel and at least one neighbouring pixel is greater than the distance between the element surface and the element opposing surface where the light-emitting elements are formed. Thus, the resin material flows less easily through the inter-pixel areas, which easily induce the voids therein.

However, void formation in the inter-pixel areas has little effect on the light-emitting elements, as no light-emitting elements are located in the inter-pixel areas.

Furthermore, void formation is constrained in the areas where the light-emitting elements are formed, such that upon light emission, the voids are less likely to cause a decrease in luminance. Additionally, this enables the suppression of flicker due to external light reflection when no light is being emitted.

In a further aspect of the display panel of the present disclosure, on the element substrate, the expansion making the distance, in the expansion, between the inter-pixel surface and the inter-element opposing surface greater than the distance, in areas other than the expansion, between the inter-pixel surface and the inter-pixel opposing surface is located between the given pixel and the neighbouring pixel.

Accordingly, the expansion easily induces the voids therein. Thus, in the event of void formation, it is more likely that the void formation occurs in the inter-pixel area where no light-emitting elements are located. Thus, a high-quality display panel is made available.

In yet a further aspect of the display panel of the present disclosure, the light-emitting elements are formed between partition walls. Accordingly, irregularities are more easily formed in the surface of the element substrate that faces the opposing substrate. By satisfying the above-discussed distance relationships, void formation over the light-emitting elements can be suppressed.

In another aspect of the display panel of the present disclosure, the partition walls are of uniform height. Accordingly, the irregularities in the surface of the element substrate that faces the opposing substrate can more easily be reduced. This simplifies control of the distance between the element substrate and the opposing substrate, so as to produce a high-quality display panel.

In an alternate aspect of the display panel of the present disclosure, an auxiliary electrode is provided between the pixels. Accordingly, in the event of void formation, the voids are collected in regions near the auxiliary electrodes, which do not affect light emission. As such, void formation between the element surface of the element substrate and the element opposing surface of the opposing substrate can be suppressed. As a result, the infiltration of water and oxygen from the outside atmosphere to the light-emitting elements and the like is preventable.

In another alternate aspect of the display panel of the present disclosure, the light-emitting elements of the pixels each emit a different color of light. Further, the colours of light emitted by the light-emitting elements of the pixels are at least three in number. Accordingly a color display panel is made available.

In yet another alternate aspect of the display panel of the present disclosure, each one of the light-emitting elements is an electroluminescence light-emitting element. Accordingly, a thin, high-efficiency display panel is made available.

In yet a further alternate aspect of the display panel of the present disclosure, the opposing substrate includes a plurality of color filters arrayed in correspondence with the different colours of light emitted by the light-emitting elements, and the primary protrusions of the opposing substrate are the color filters. Accordingly, although irregularities are more easily formed in the surface of the opposing substrate that faces the element substrate, void formation over the light-emitting elements can be suppressed by satisfying the above-discussed distance relationship.

In still a further aspect of the display panel of the present disclosure, the opposing substrate includes a black matrix partitioning the color filters in correspondence with the colours of light, and the opposing substrate reference surface is a surface of the black matrix facing the element substrate. Accordingly, the reference surface is more likely made more uniform (i.e., the reference surface is less subject to fluctuations). This simplifies control of the distance between the element substrate and the opposing substrate, so as to produce a high-quality display panel.

In still another aspect of the display panel of the present disclosure, the expansion is located at an approximate midpoint of the inter-pixel area. Accordingly, there is an increase in probability that void formation will occur at the position farthest from the light-emitting elements, i.e., in the inter-pixel area between neighbouring pixels where no light-emitting elements are formed. As such, a high-quality display panel is made available.

In still another alternate aspect of the display panel of the present disclosure, the primary protrusions equivalent to the color filters each protrude with respect the opposing substrate reference surface to a different degree, such that the distance between the element surface and the element opposing surface is minimized at a middle light-emitting element for each of the pixels. Further, for at least one given pixel, the distance between the element surface and the element opposing surface corresponding to each of the light-emitting elements of the given pixel is greater than a distance between neighbouring light-emitting elements of the given pixel. Accordingly, the inter-pixel area easily induces the voids therein, such that a high-quality display panel is made available.

A display panel manufacturing method of the present disclosure comprises: an element substrate formation step of forming an element substrate having a plurality of pixels, each pixel having at least one light-emitting element; an opposing substrate formation step of forming an opposing substrate arranged so as to oppose the element substrate; and a sealing resin layer formation step of forming a sealing resin layer, respective surfaces of the element substrate formed in the element substrate formation step and the opposing substrate formed in the opposing substrate formation step facing each other, the sealing resin layer being interposed between and adjoining the element substrate and the opposing substrate, and sealing the light-emitting elements, wherein for the element substrate formation step and the opposing substrate formation step an element surface is defined as a top surface of the element substrate on one of the light-emitting elements, an element opposing surface is defined as a surface of the opposing substrate opposite the element surface, an inter-pixel surface is defined as a top surface of the element substrate between neighbouring pixels, an inter-pixel opposing surface is defined as a surface of the opposing substrate opposite the inter-pixel surface, an inter-element surface is defined as a top surface of the element substrate between neighbouring light-emitting elements within one of the pixels, an inter-element opposing surface is defined as a surface of the opposing substrate opposite the inter-element surface, and the element substrate and the opposing substrate are formed such that: on the element substrate, for at least one given pixel, a distance between the element surface and the element opposing surface corresponding to each of the light-emitting elements of the given pixel is smaller than: a distance between the inter-element surface and the inter-element opposing surface in an inter-pixel area between the given pixel and at least one neighbouring pixel; and a distance between the inter-element surface and the inter-element opposing surface corresponding to the light-emitting elements of the given pixel, and on the element substrate, the distance between the given pixel and the neighbouring pixel is greater than a distance between one of the light-emitting elements of the given pixel and a neighbouring light-emitting element of the given pixel, and a distance in an expansion between the inter-pixel surface and the inter-pixel opposing surface is greater than a maximum distance between the inter-element surface and the inter-element opposing surface, the expansion being located between the given pixel and the neighbouring pixel.

Further, an element substrate reference surface is defined as a surface of the element substrate located on the inter-pixel area and nearest the opposing substrate, the element substrate has primary recesses each located on one of the light-emitting elements and recessed with respect to the element substrate reference surface, a bottom of each primary concavity being the element surface and the element substrate reference surface being the inter-pixel surface, an opposing substrate reference surface is defined as a surface of the opposing substrate opposite the element substrate reference surface, and the opposing substrate has primary protrusions each located opposite one of the primary concavities and protruding from the opposing substrate reference surface, a top face of each primary protrusion being the element opposing surface and the opposing substrate reference surface being the inter-pixel opposing surface.

Accordingly, a distance between the element surface and the element opposing surface, where the light-emitting elements are formed, is narrower than a distance between the inter-pixel surface and the inter-pixel opposing surface in an inter-pixel area between the given pixel and at least one neighbouring pixel, in inter-pixel areas where no light-emitting elements are formed. Thus, the fluidity of the resin material is increased where the light-emitting elements are formed, thereby enabling the suppression of void formation in the vicinity of the light-emitting elements. Conversely, the distance between the inter-pixel surface and the inter-pixel opposing surface in an inter-pixel area between the given pixel and at least one neighbouring pixel is greater than the distance between the element surface and the element opposing surface in the inter-pixel areas, where no light-emitting elements are formed. Thus, the resin material flows less easily through the inter-pixel areas, which easily induce the voids therein. However, void formation in the inter-pixel areas has no effect on the light-emitting elements, as no light-emitting elements are located in the inter-pixel areas.

In an alternative aspect of the display panel manufacturing method of the present disclosure, an auxiliary electrode is provided between the pixels. Accordingly, any voids formed are collected in regions near the auxiliary electrodes without affecting light emission. As such, void formation between the element surface of the element substrate and the element opposing surface of the opposing substrate is constrainable. As a result, the infiltration of water and oxygen from the outside atmosphere to the light-emitting elements and the like is preventable.

In another alternate aspect of the display panel manufacturing method of the present disclosure, the light-emitting elements of the pixels each emit a different color of light. Accordingly, a color display panel is made available.

In still a further aspect of the display panel manufacturing method of the present disclosure, the opposing substrate includes a plurality of color filters arrayed in correspondence with the different colours of light emitted by the light-emitting elements, and a black matrix partitioning the color filters in correspondence with the colours of light, the primary protrusions of the opposing substrate are the color filters, and the opposing substrate reference surface is a surface of the black matrix facing the element substrate. Accordingly, the reference surface is more easily made uniform (i.e., the reference surface is free of fluctuations). This simplifies control of the distance between the element substrate and the opposing substrate, so as to produce a high-quality display panel.

In still another aspect of the display panel manufacturing method of the present disclosure, the expansion is located at an approximate midpoint of the inter-pixel area. Accordingly, there is an increase in probability that void formation will occur at the position farthest from the light-emitting elements, i.e., in the inter-pixel area between neighbouring pixels where no light-emitting elements are formed. As such, a high-quality display panel is made available.

In still another alternate aspect of the display panel manufacturing method of the present disclosure, the primary protrusions equivalent to the color filters each protrude with respect the opposing substrate reference surface to a different degree, such that the distance between the element surface and the element opposing surface is minimized at a middle light-emitting element for each of the pixels. Further, for at least one given pixel, the distance between the element surface and the element opposing surface corresponding to each of the light-emitting elements of the given pixel is greater than a distance between neighbouring light-emitting elements of the given pixel. Accordingly, the inter-pixel area is made to more easily induce the voids therein, such that a high-quality display panel is made available.

Exemplary Embodiment

The display panel pertaining to the exemplary Embodiment is described below, with reference to the accompanying drawings. No particular limitation is intended regarding the materials and quantities thereof used in the present disclosure as described in the exemplary Embodiment. The exemplary Embodiment may be optionally modified, as appropriate, and combined with other Embodiments, provided that the technical scope of the disclosure is not exceeded in doing so, and that no contradictions result.

1. Overall Configuration

The overall configuration of a display device 1 pertaining to the exemplary Embodiment is described below, with reference to the accompanying drawings.

FIG. 1 is a block diagram schematically representing the overall configuration of the display device 1.

As shown, the display device 1 includes a display panel 10 and a drive control unit 20 connected thereto.

The display panel 10 is, for example, a top emission organic electroluminescent display panel making use of the organic material electroluminescence effect. The drive control unit 20 includes four drive circuits 21-24 and a control circuit 25 controlling the drive circuits 21-24.

No limitation is intended regarding the display panel being an organic electroluminescent panel using organic materials. The display panel may optionally be an inorganic electroluminescent panel using inorganic materials. Further, no limitation is intended regarding the display panel being a top emission device. The display panel may optionally be a bottom emission device.

No limitation is intended regarding the arrangement of the drive control unit 20, nor regarding the quantity of drive circuits. For example, the control circuit and drive circuits may optionally be integrated as a single circuit.

2. Configuration of Display Panel 10

The configuration of the display panel 10 is described below.

Figure 2:
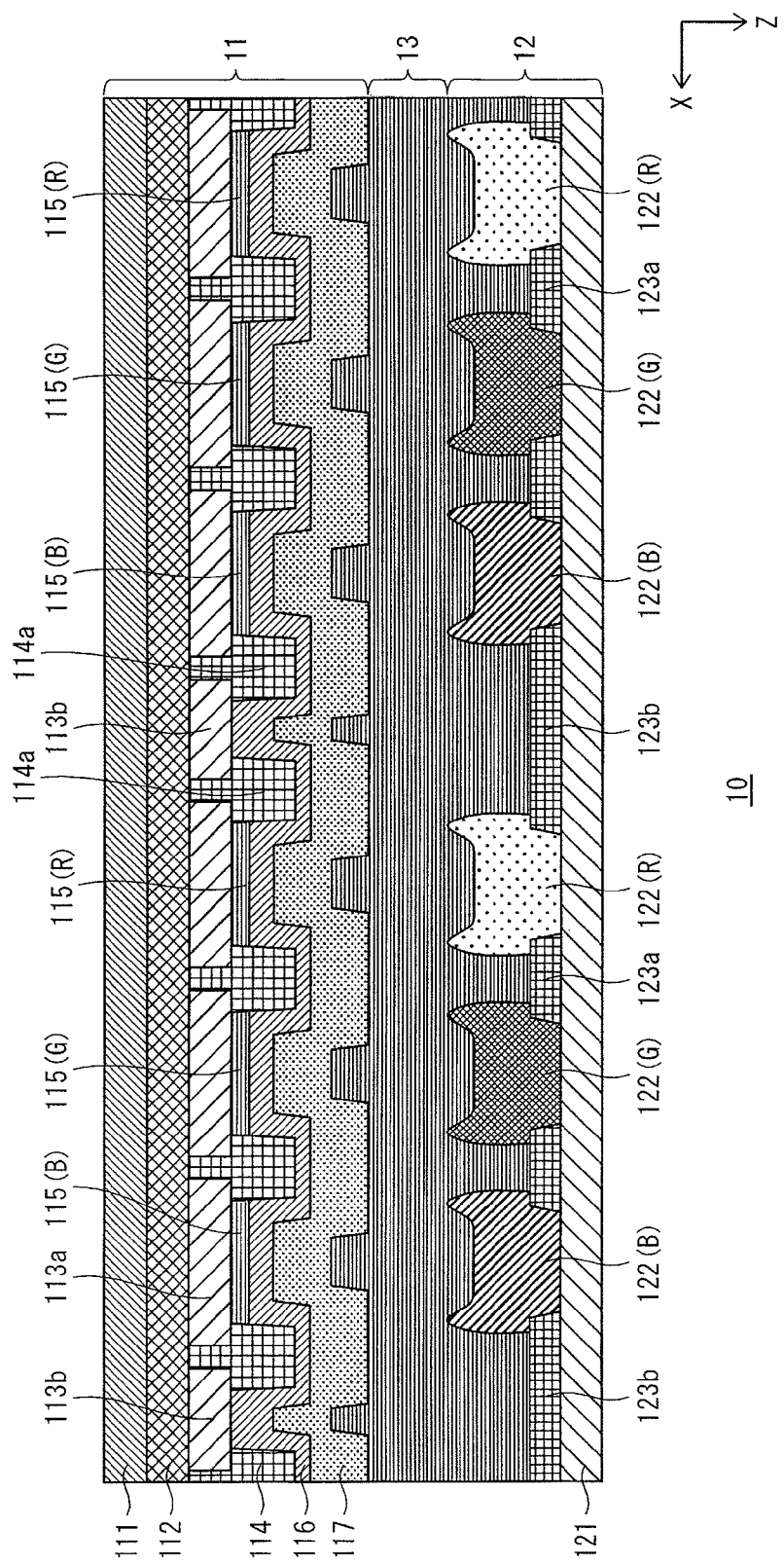
FIG. 2 is a cross-sectional diagram schematically illustrating key components of a display panel pertaining to the exemplary Embodiment.

FIG. 2 is a cross-sectional diagram schematically illustrating the key components of the display panel 10 pertaining to the Embodiment.

As shown, the display panel 10 has an electroluminescent substrate 11 (hereinafter, EL substrate, corresponding to the element substrate of the disclosure), a color filter substrate 12 (hereinafter, CF substrate, corresponding to the opposing substrate of the disclosure), and a sealing resin layer 13 that is interposed between the EL substrate 11 and the CF substrate 12. The sealing resin layer 13 is provided in order to join the EL substrate 11 and the CF substrate 12, as well as to prevent the intrusion of water, gases, and other outside elements into the EL substrate 11 (i.e., to the light-emitting elements).

Let the light output surface of the display panel 10 be the top or upper surface thereof, so as to correspond to the arrow indicating the Z axis in FIG. 2.

(1) EL Substrate

The EL substrate 11 includes a plurality of pixels, each including at least one light-emitting element for display purposes. The EL substrate 11 is made up of a substrate body, an inter-layer insulating membrane, anodes, banks, light-emitting layers, and so on.

Figure 3:
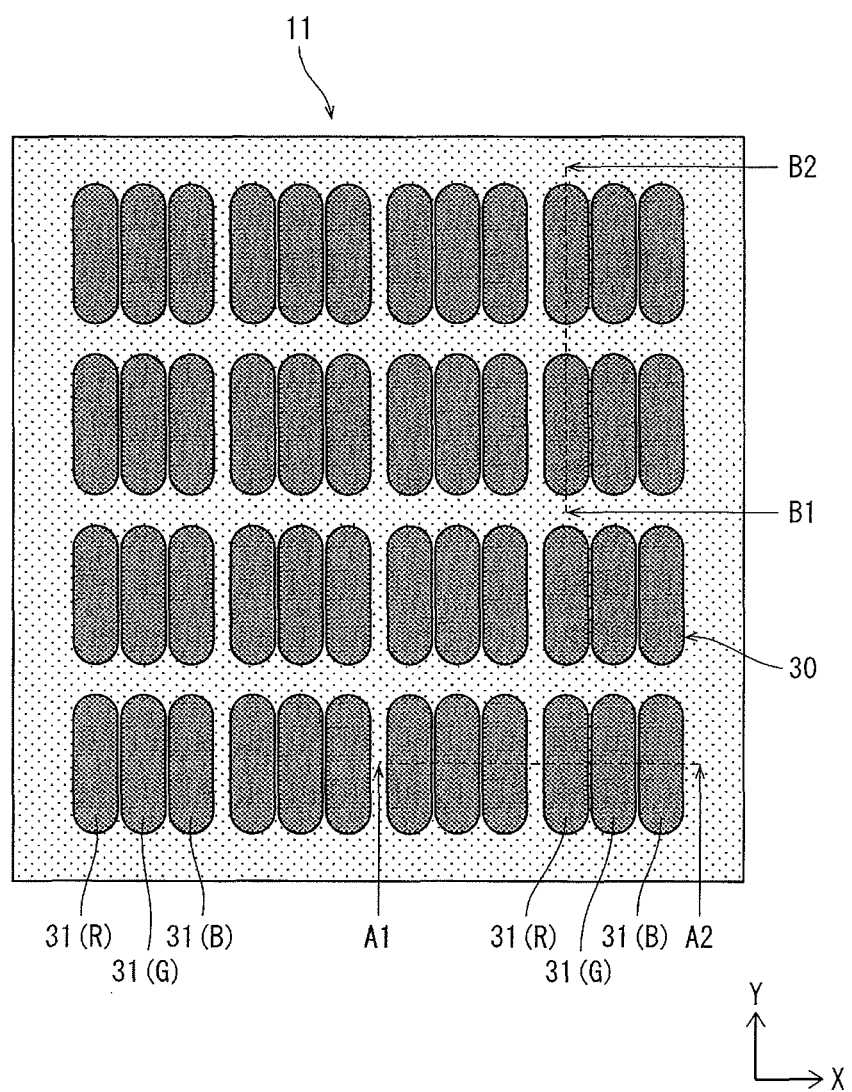
FIG. 3 is a plane-view diagram of an EL substrate.
Figure 4:
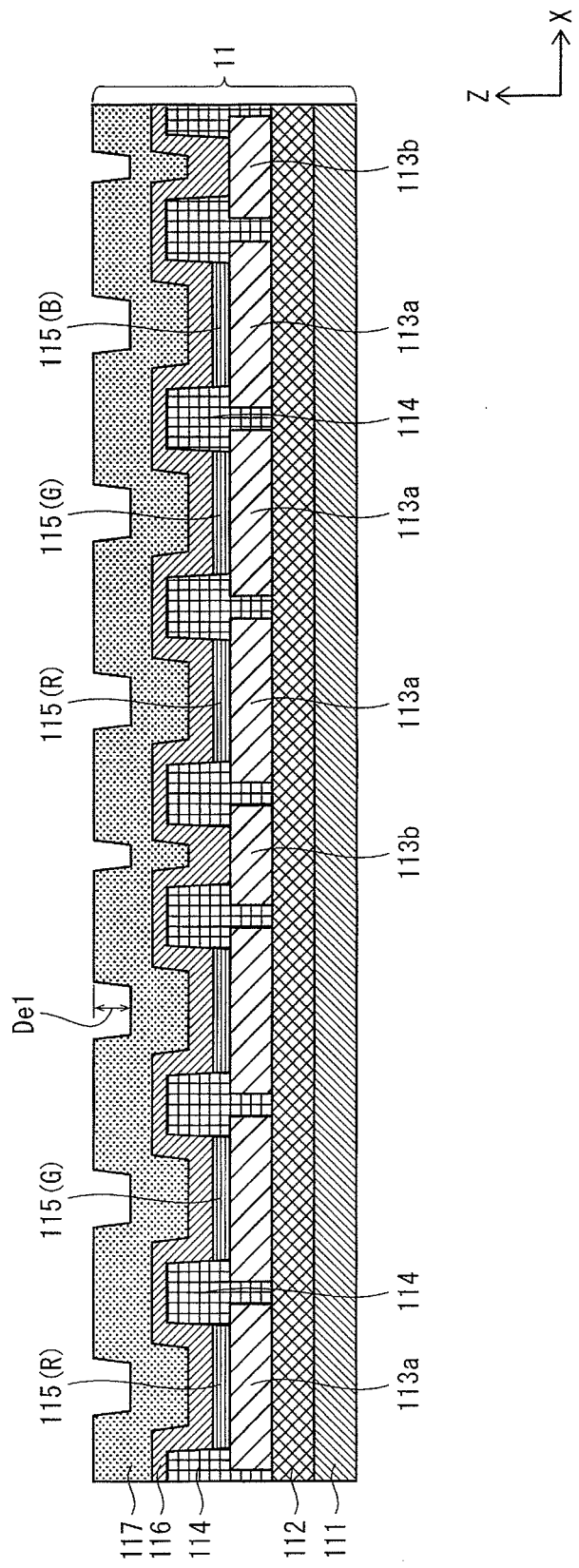
FIG. 4 is a cross-sectional diagram taken along line A1-A2 of FIG. 3.
Figure 5:
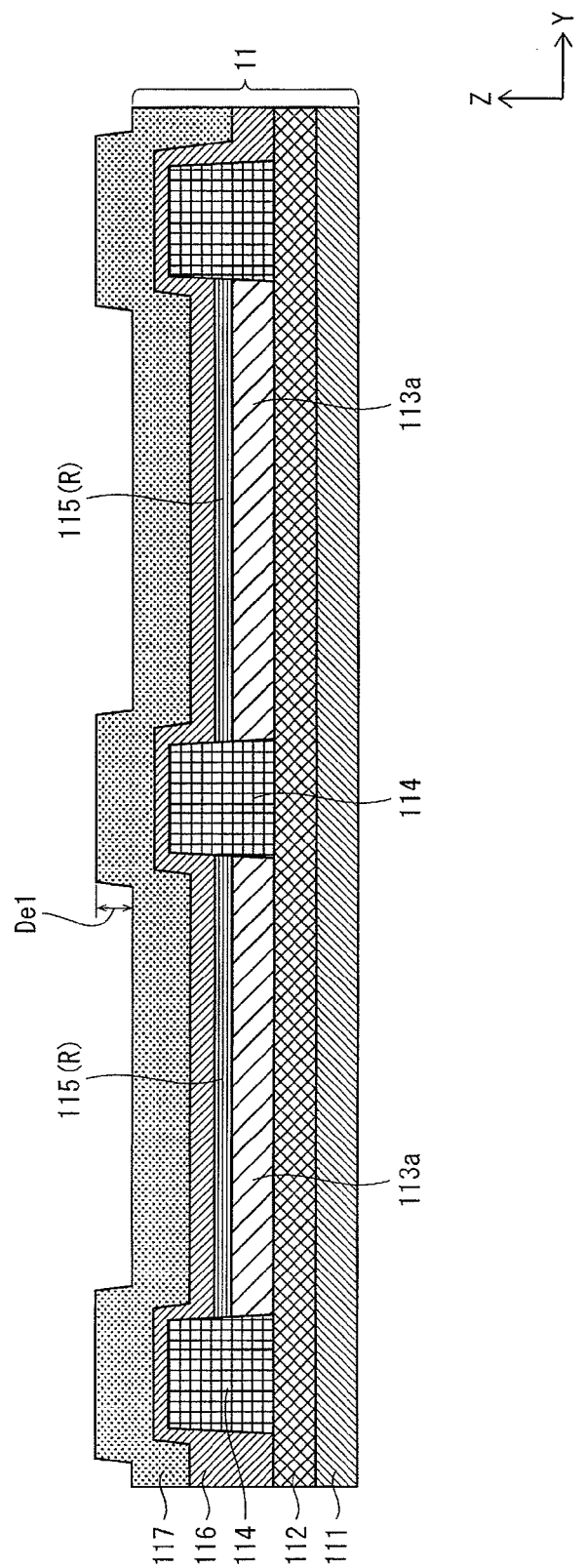
FIG. 5 is a cross-sectional diagram taken along line B1-B2 of FIG. 3.

FIG. 3 is a plane-view diagram of the EL substrate 11. FIG. 4 is a cross-sectional diagram taken along line A1-A2 of FIG. 3. FIG. 5 is a cross-sectional diagram taken along line B1-B2 of FIG. 3.

The top or upper surface of the EL substrate 11 is the surface thereof joined to the CF substrate 12, corresponding to the Z-axis direction indicated by FIG. 2.

The EL substrate 11 has a plurality of pixels 30 arranged in the X-Y plane along the substrate body surface. Each one of the pixels 30 is made up of three sub-pixels (in three colors (R, G, and B)) 31 (R), 31 (G), and 31(B).

Each one of the sub-pixels 31 corresponds to one of the light-emitting elements of the disclosure. Each of the pixels is made up of three of the sub-pixels. Reference sign 31 hereinafter denotes the sub-pixels in generality, without regard for the color emitted thereby.

Each of the sub-pixels 31 is elongated in the Y direction. The three sub-pixels 31(R), 31(G), and 31(B) are aligned in the X direction such that each of the pixels 30 forms an approximate square when viewed in the plane.

The following explanations primarily reference FIGS. 4 and 5.

A thin-film transistor (hereinafter, TFT) substrate 111 serves as the substrate body. An inter-layer insulating membrane 112 is, for example, formed on the top surface of the TFT substrate 111. The inter-layer insulating membrane 112 is provided so as to compensate for surface gradations in the TFT substrate 111. The TFT substrate 111 with the inter-layer insulating membrane formed thereon may optionally serve as the substrate body.

An anode 113*a* is disposed at the top surface of the inter-layer insulating membrane 112 for each of the sub-pixels 31. Each anode 113*a* is shaped so as to be elongated in the Y direction, like the sub-pixels 31 as seen in the plane view.

As shown in FIGS. 2 and 4, auxiliary electrodes 113*b* are formed at the top surface of the inter-layer insulating membrane 112 between the pixels 30.

A bank 114 (corresponding to the partition walls of the disclosure) is formed between any two neighbouring anodes 113*a* and between any given anode 113*a* and neighbouring auxiliary electrode 113*b*. Each bank 114 extends from an area on the inter-layer insulating membrane 112 where no anode 113a or auxiliary electrode 113b is formed so as to pass between the anodes 113a and the auxiliary electrodes 113b while partly overlapping the top circumferential edges thereof. Each bank is, for example, shaped as an upwardly-protruding trapezoid when viewed in cross-section.

A light-emitting layer emitting light of a predetermined color, e.g., an organic light-emitting layer 115, is layered over each anode 113a within a region defined by the banks 114 (i.e., surrounded by the banks 114).

A blue organic light-emitting layer 115 (B), a green organic light-emitting layer 115 (G), and a red organic light-emitting layer 115 (R) are represented in the drawings. Reference sign 115 hereinafter denotes the organic light-emitting layers in generality, without regard for the color emitted thereby.

A cathode 116 and a sealing layer 117 are respectively formed on the organic light-emitting layer 115 so as to traverse the areas defined by the banks 114 and be continuous with the neighbouring organic light-emitting layers 115 and auxiliary electrodes 113b. That is, the cathode 116 is formed at the top surface of the organic light-emitting layer 115, at the top face of each auxiliary electrode 113b in areas thereof not covered by the banks 114, and at the top face and side faces of the banks 114. The sealing layer 117 is formed at the top face of the cathode 116.

The sealing layer 117 serves to prevent the exposure of the organic light-emitting layers 115 and so on to water and air. The top surface of the sealing layer 117 is uneven due to irregularities caused by the banks 114. The term "irregularities" is hereinafter used to denote a combination of concavities and protrusions.

On the surface of the EL substrate 11, configured as described above, opposite the CF substrate 12 (i.e., the top surface of the sealing layer 117), any portion arranged above the area between neighbouring pixels 30, or in other words, a portion of the surface above the banks 114 formed between neighbouring pixels 30, is termed an inter-pixel surface, or reference surface.

Also, on the top face of the EL substrate 11, configured as described above, any portion arranged above the sub-pixels making up each of the pixels 30, or in other words, a (portion of the) surface arranged above the organic light-emitting layers 115, is termed a primary concavity 118 with respect to the reference surface of the EL substrate 11. The bottom of the primary concavity 118 is termed a sub-pixel surface (or element surface).

Further, on the top face of the EL substrate 11, configured as described above, any portion arranged above a midpoint between adjacent pixels 30 is termed a secondary concavity 119 in the reference surface of the EL substrate 11. The portion in which the secondary concavity 119 is formed corresponds to the expansion (or an expansion portion) of the present disclosure.

(2) CF Substrate

Figure 6:
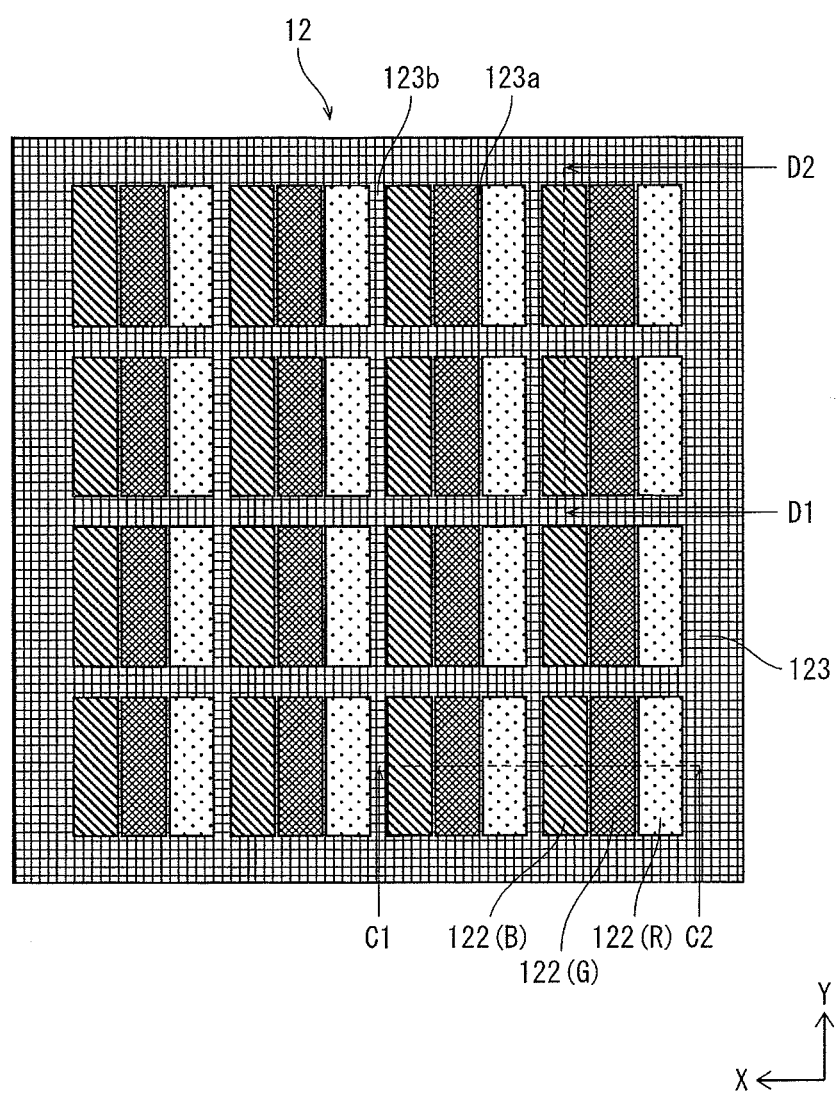
FIG. 6 is a plane-view diagram of a CF substrate.
Figure 7:
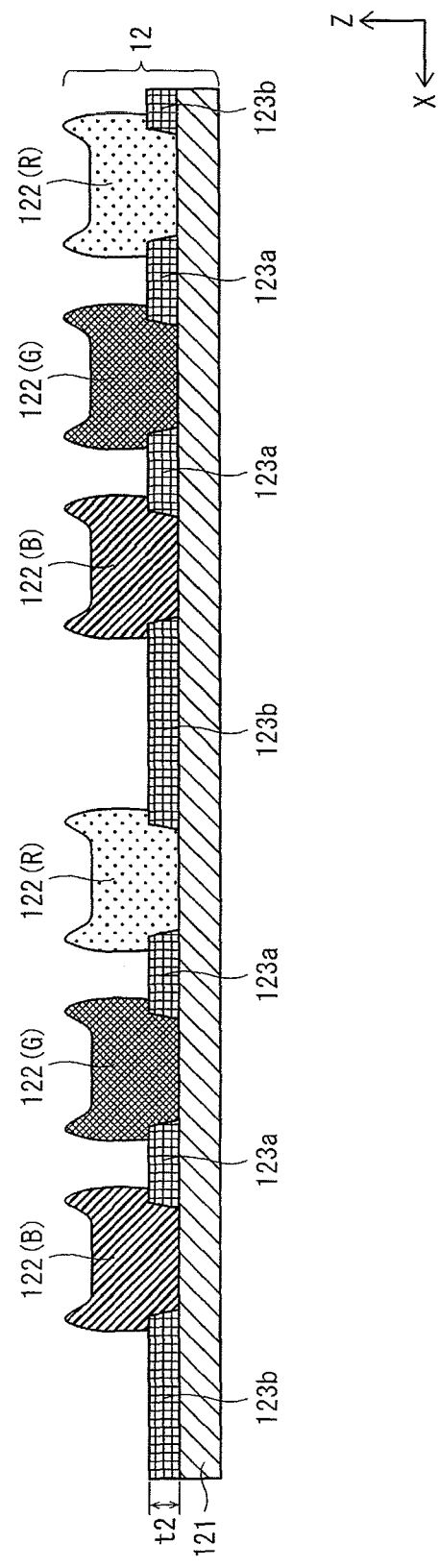
FIG. 7 is a cross-sectional diagram taken along line C1-C2 of FIG. 6.
Figure 8:
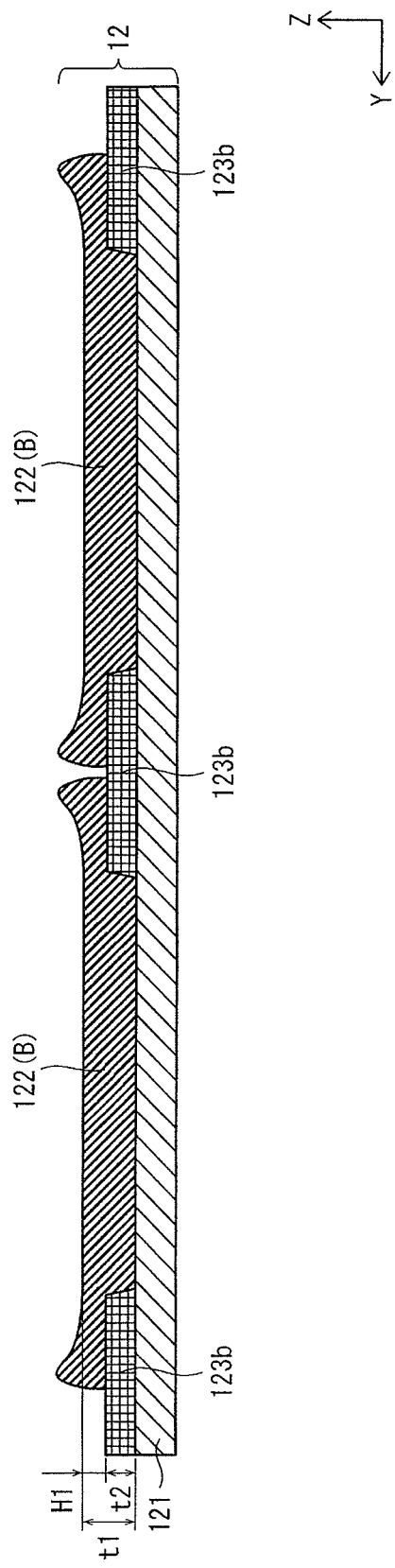
FIG. 8 is a cross-sectional diagram taken along line D1-D2 of FIG. 6.

FIG. 6 is a plane-view diagram of the CF substrate 12. FIG. 7 is a cross-sectional diagram taken along line C1-C2 of FIG. 6. FIG. 8 is a cross-sectional diagram taken along line D1-D2 of FIG. 6.

The CF substrate 12 includes a substrate body 121, color filters 122, and so on.

As shown in FIG. 6, each of the color filters 122 is elongated in the Y direction when viewed in the plane, similar to the sub-pixels 31 illustrated by FIG. 3.

The following explanations primarily reference FIGS. 7 and 8.

The substrate body 121 is the frontal substrate of the display panel 10, and is made of a translucent material. Color filters 122 (B), 122 (G), and 122 (R) are formed on the top surface of the substrate body 121, respectively corresponding to the organic light-emitting layers 115 (B), 115 (G), and 115 (R) of the EL substrate 11, i.e., to the sub-pixels 31 (B), 31 (G), and 31(R). Reference sign 122 hereinafter denotes the color filters in generality, without regard for emitted color.

A black matrix (hereinafter abbreviated BM) 123 is arranged at the top surface of the substrate body 121 between the color filters 122, that is, between the sub-pixels 31. As shown in FIGS. 7 and 8, each of the color filters 122 is shaped so as to partly overlap the top circumferential edge of the neighbouring BM 123 to each side.

The BM 123 is a black layer provided to improve display contrast by preventing external light from reflecting on or entering the display surface of the display panel 10. As shown in FIG. 2, the BM 123 is shaped to correspond to (i.e., to oppose) the banks 114 of the EL substrate 11. Specifically, portions thereof between pixels (i.e., any portion facing one of the auxiliary electrodes 113b) are shaped to correspond to two of the banks 114a, having a greater width (shown as the lateral dimension in the drawings) than the BM 123(a) portions between the color filters 122.

In order to distinguish BM portions arranged between the sub-pixels 31 from BM portions arranged between the pixels 30, the former portions are termed inter-subpixel BM and take the reference sign 123a while the BM portions arranged between neighbouring pixels 30 are termed inter-pixel BM and take the reference sign 123b. Also, reference sign 123 hereinafter denotes the BM in generality, without regard for position.

As shown in FIG. 6, the BM 123 is shaped so as to be between the sub-pixels 31 of the EL substrate 11 and exclude the areas where the color filters 122 are formed. That is, as shown in FIGS. 6 through 8, the BM 123 is shaped as a grid partitioning the color filters 122.

On the surface of the CF substrate 12, configured as described above, opposite the EL substrate 11, any portions facing the sub-pixel surface of the EL substrate 11, or in other words, a top face of the color filter 122 corresponding to a primary protrusion of the disclosure, is termed a sub-pixel opposing surface (or element opposing surface).

Also, on the top face of the CF substrate 12, configured as described above, any portion arranged to face inter-pixel surfaces of the EL substrate 11, or in other words, a portion where the inter-pixel BM 123b is formed, is termed an inter-pixel opposing surface or reference surface.

(3) Positional Relationship of EL Substrate and CF Substrate

Figure 9:
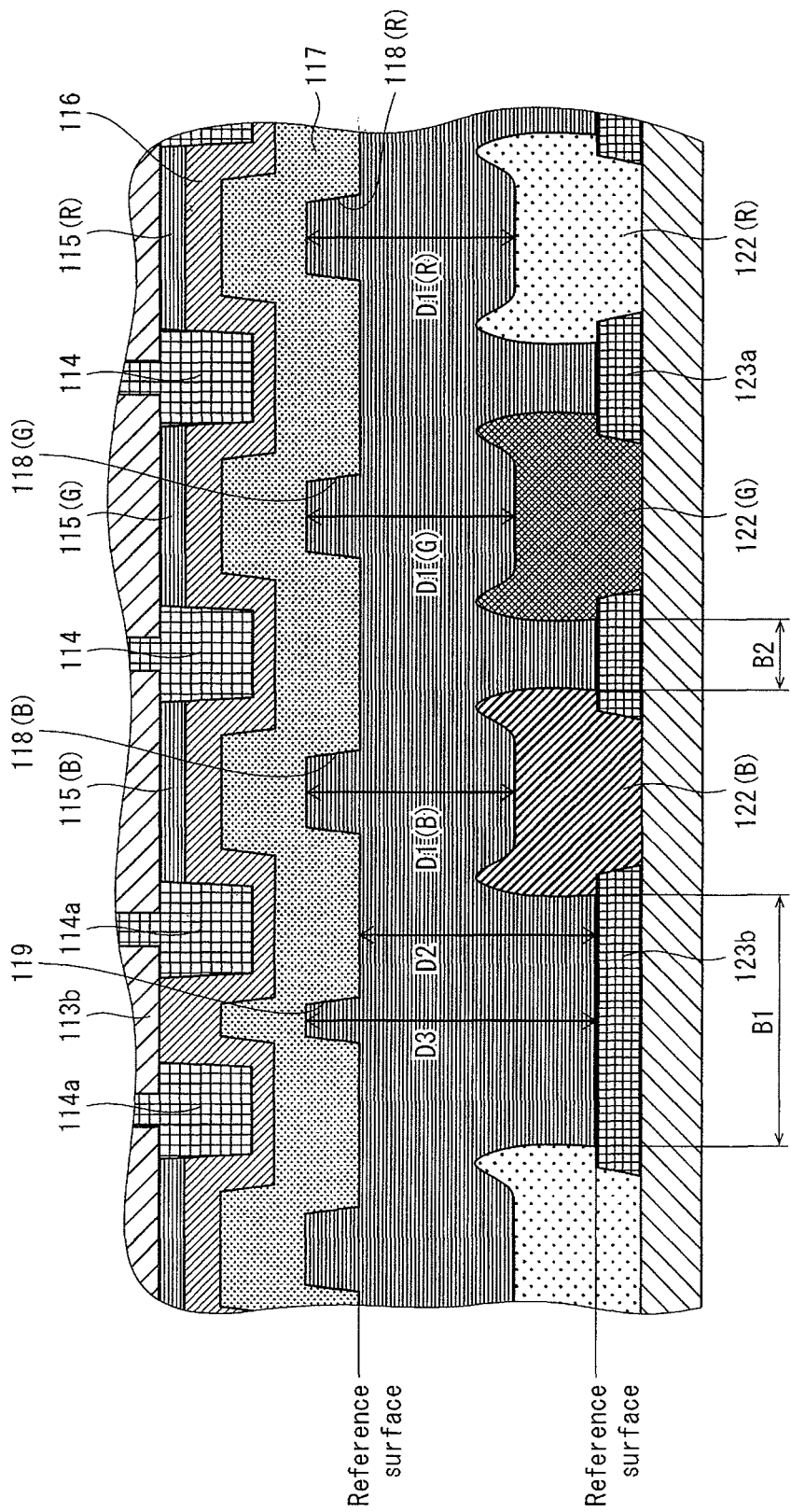
FIG. 9 is a diagram illustrating the positional relationship between the EL substrate and the CF substrate.

FIG. 9 illustrates the positional relationship of the EL substrate 11 and the CF substrate 12.

As described above, with respect to the inter-pixel surface (reference surface), the surface of the EL substrate has primary concavities 118 each formed in a portion corresponding to an area between the banks 114.

The primary concavities 118 are made to correspond to the organic light-emitting layers 115 (B), 115 (G), and 115 (R). A specific primary concavity is indicated using the reference sign 118 (B), 118 (G), or 118 (R), while the primary concavities in generality take the reference sign 118.

As described above, with respect to the inter-pixel opposing surface (reference surface), the surface of the CF substrate 12 has protruding portions where the color filters 122 are formed.

In the CF substrate 12, the respective distance between the sub-pixel opposing surface, which is the top face of each color filter 122 (B), 122 (G), and 122 (R), and the sub-pixel surface, which is the respective bottom of each primary concavity 118 (B), 118 (G), and 118 (R) in the EL substrate 11, is termed D1

(B), D1 (G) and D1 (R). Likewise, the distance between the reference surface of the CF substrate 12 (i.e., the top surface of the BM 123) and the reference surface of the EL substrate 11 (i.e., the inter-pixel surface) is termed D2, while the distance between the reference surface of the CF substrate 12 and one of the secondary concavities 119 between the pixels in the EL substrate 11 is termed D3. These distances are expressed as the minimum distances between the two substrates.

Thus, the following relations hold between the EL substrate 11 and the CF substrate 12.

Given $D2>D1, D2>D1(B)$, given $D2>D1, D2>D1(G)$, and given $D2>D1, D2>D1(R)$.

Further, the following relation beneficially holds, in addition to the above.

$D3>D2$.

When the EL substrate 11 and the CF substrate 12 are viewed in the plane, any area of the EL substrate 11 corresponding to one of the pixels 30 is termed a pixel area, and any area of the EL substrate 11 corresponding to an area between adjacent pixels 30 is termed an inter-pixel area.

As shown in FIG. 7, the color filter surface (element surface, i.e., the top face of each primary protrusion) at D1 (B), D1 (G), and D1 (R), described above, is at the center of each color filter 122, as viewed in the plane. In this example, this is the thinnest portion of the thin film.

By satisfying the above-stated relations, void formation can be suppressed in the sealing resin layer 13, and it becomes more likely that the voids are located in the inter-pixel area over the inter-pixel BM 123b, in the event of void formation.

This is because, within the pixel area, distance D1 is the narrowest distance between the EL substrate 11 and the CF substrate 12, and the resin material of the sealing resin layer 13 is pressed therein. As a result, any voids are also pressed along with the resin material, such that the voids are unlikely to remain in any of the pixel areas. The pressing action of the resin material in narrow-distance areas is theorized to be driven by a mechanism similar to the capillary action effect, as described later.

Also, as shown in FIG. 9, with respect to the CF substrate 12, the distance between the pixels is termed B1 while the distance between the color filters 122 is termed B2.

As such, the following relation holds, regarding the distance between protrusions (i.e., the color filters) on the CF substrate 12.

$B1>B2$

Furthermore, $B2<D1$

Satisfying the above-stated relations allows the constraint of void formation in the pixel areas, and also improves the likelihood that any voids formed are located in the inter-pixel areas over the inter-pixel BM 123b. This occurs due to the reasons described above. In contrast to conventional technology, voids do not form over the sub-pixels, as any voids formed do so in the inter-pixel areas over the inter-pixel BM 123b and have little effect on the sub-pixels.

Furthermore, the position at which the distance between the EL substrate 11 and the CF substrate 12 is greatest (i.e., the position of distance D3) is the approximate midpoint between pixels (while designed to be at the midpoint, manufacturing variations may lead to deviations). Accordingly, any voids formed in the sealing resin layer 13 are more likely to be in the inter-pixel area. This occurs due to the reasons described above.

3. Manufacturing Method

The display panel 10 is manufactured in a process that involves a preparation step for the EL substrate 11, a preparation step for the CF substrate 12, and a joining step of joining the EL substrate 11 and the CF substrate 12 so prepared.

(1) EL Substrate Preparation Step

The manufacturing process for the EL substrate 11 is described below.

FIGS. 10A through 10D and 11A through 11D illustrate the manufacturing process for the EL substrate 11.

Figure 10A:
FIGS. 10A through 10D illustrate an example of an EL substrate manufacturing process.
Figure 10B:
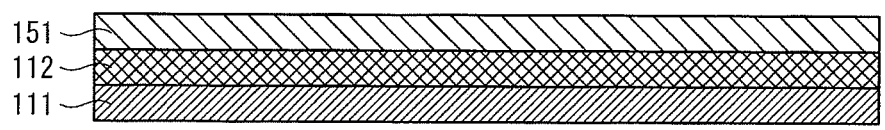
Figure 10C:
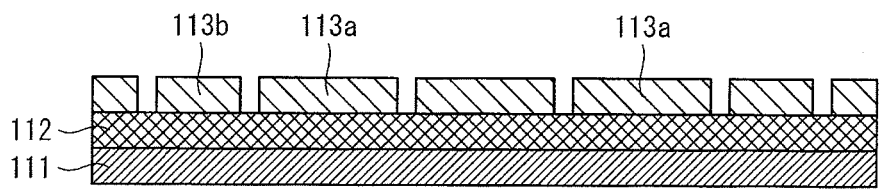

First, the inter-layer insulating membrane 112 is formed over the TFT substrate 111 (FIG. 10A). Subsequently, a metallic thin-film 151 is formed on the top surface of the inter-layer insulating membrane 112 for use as the anodes 113a and the auxiliary electrodes 113b (FIG. 10B). Patterning is applied to the metallic thin-film 151 to obtain the anodes 113a and the auxiliary electrodes 113b (FIG. 10C). For example, the metallic thin-film 151 is formed using a sputtering method, and patterning is applied thereto using a photolithography method.

Figure 10D:
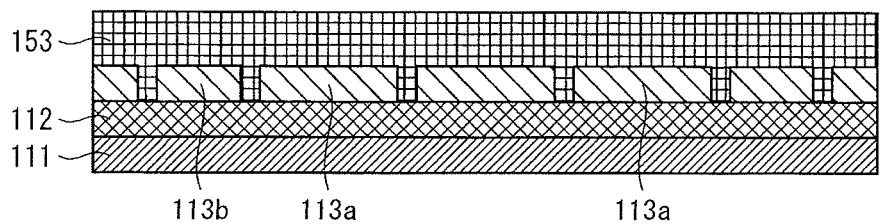
Figure 11A:
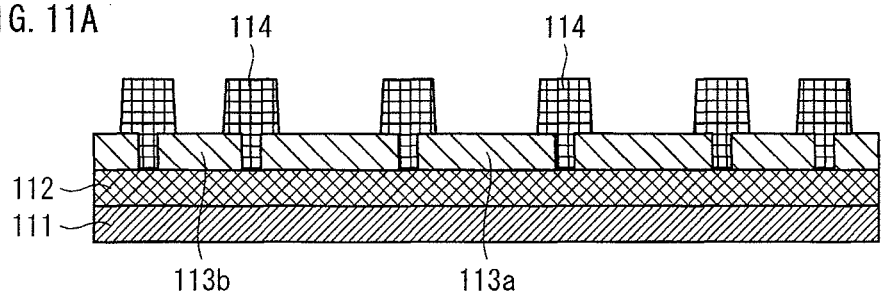
FIGS. 11A through 11D further illustrate the example of the EL substrate manufacturing process.

Next, a bank material layer 153 is formed from an insulating organic material serving as the material for the banks (FIG. 10D). Patterning is then applied to the bank material layer 153 to obtain the banks 114 (FIG. 11A). For example, the bank material layer is formed by coating or similar, and patterning is applied thereto by, for example, overlaying with a mask having apertures of predetermined dimensions, exposing the top of the mask to light, and then washing the remnants of the bank material layer 153 with developer solution (i.e., by a wet process).

Figure 11B:
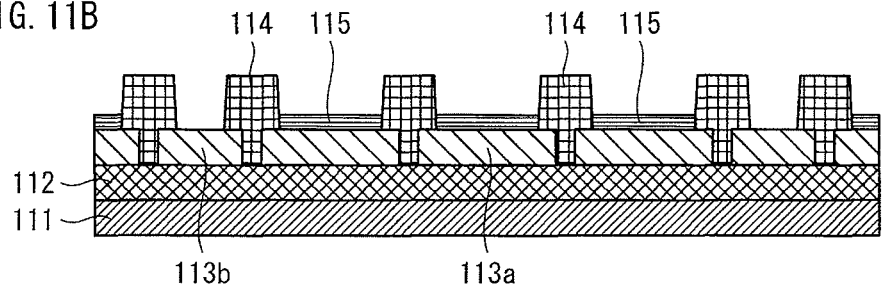

Once the banks 114 are formed, the organic light-emitting layers 115 are formed in the regions partitioned by the banks 114 (FIG. 11B). For example, the organic light-emitting layers 115 are formed by using an inkjet method to drip an ink compound that includes an organic EL material, and then drying the ink.

Figure 11C:
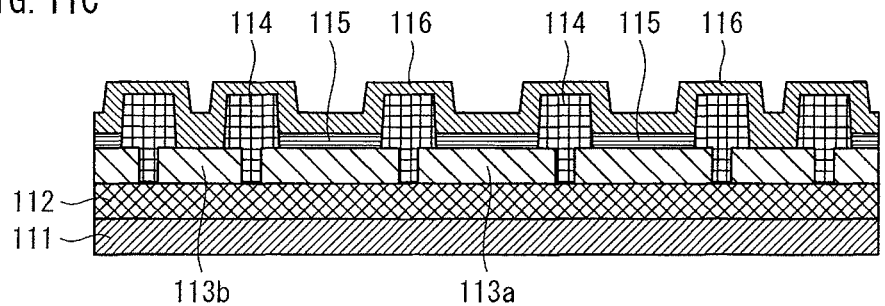
Figure 11D:
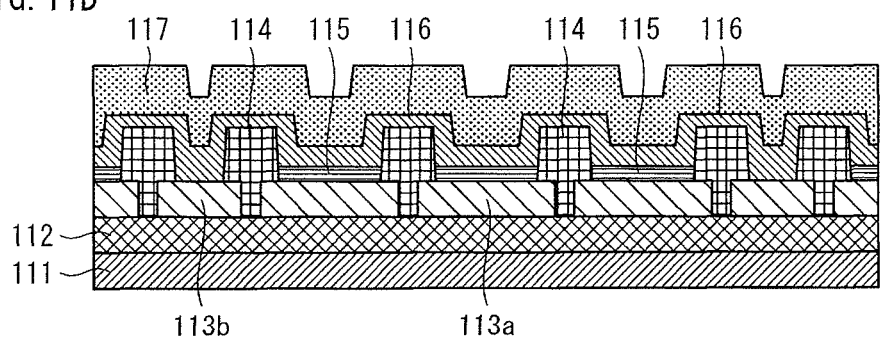

Subsequently, the cathode 116 is formed so as to cover the top faces of the banks 114 and of the organic light-emitting layers 115 (FIG. 11C). Then, the sealing layer 117 is formed (FIG. 11D).

For example, the cathode 116 is formed using sputtering, and the sealing layer 117 is formed using sputtering, chemical vapor deposition (hereinafter, CVD), atomic layer deposition (hereinafter, ALD), or similar methods.

(2) Color Filter Preparation Step

The manufacturing process for the CF substrate 12 is described below.

FIGS. 12A through 12C and 13A through 13C illustrate the manufacturing process for the CF substrate 12.

Figure 12A:
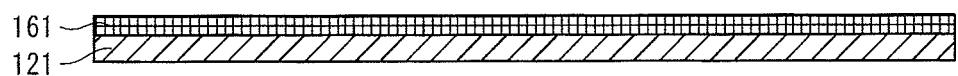
FIGS. 12A through 12C illustrate an example of a CF substrate manufacturing process.

First, BM material, having a UV-curable resin (e.g., a UV-curable acrylic resin) serving as the principal component with a black pigment added thereto, is dissolved in a solvent to prepare a BM paste 161. The BM paste 161 is then used to coat one face of the substrate body 121 (FIG. 12A).

Figure 12B:
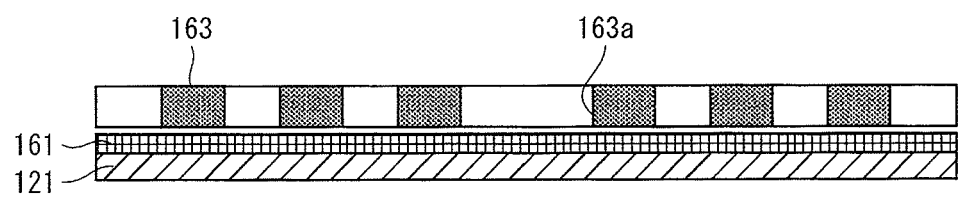

After coating, the BM paste 161 is dried until the solvent is vaporized and the paste can hold a shape, whereupon a pattern mask 163 having apertures 163a of predetermined dimensions is overlaid so as to correspond to the positions of the banks 114 (FIG. 12B).

Figure 12C:
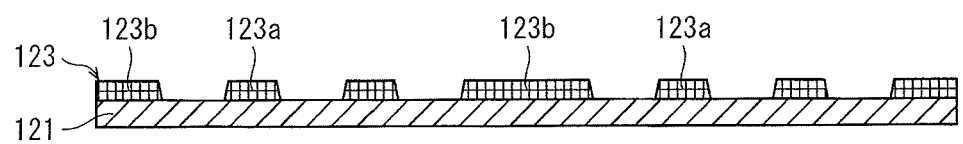

UV rays are then used to irradiate the top of the overlaid pattern mask 163. As a result, the BM paste 161 is baked, the pattern mask 163 and any unsolidified BM paste 161 are removed, and then developing and curing are performed. Thus, as shown in FIG. 12C, the BM 123a and 123b is formed so as to correspond to the banks 114.

Next, material for color filter 122 (R), having a UV-curable resin as the principal component, is dissolved in solvent to obtain filter paste (R), which is coated onto the surface (i.e. the top face) of the substrate body 121 where the BM 123 is formed. Upon removing a certain amount of the solvent, a predetermined pattern mask is installed and irradiated with UV rays.

Figure 13A:
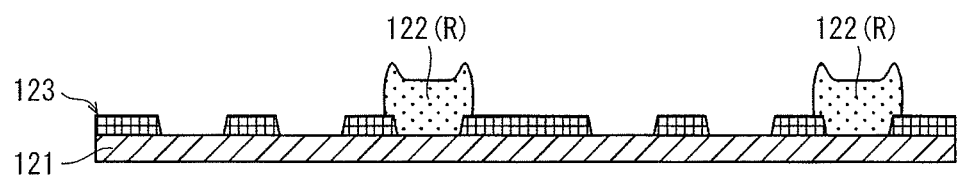
FIGS. 13A through 13C further illustrate the example of the CF substrate manufacturing process.

Afterward, curing is performed, the pattern mask and any uncured filter paste (R) are removed, and development is performed. Thus, as shown in FIG. 13A, the color filter 122 (R) is formed. The color filter 122 (R) is formed along a piece of the BM 123 so as to partly overlap the edges of neighbouring pieces of the BM 123.

Figure 13B:
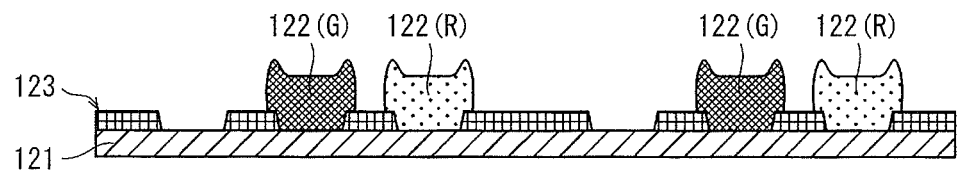
Figure 13C:
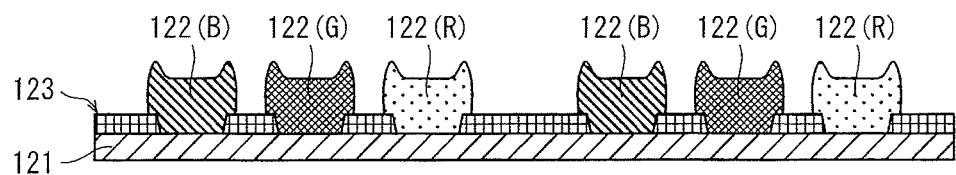

The steps described above for forming the color filter 122 (R) are repeated with appropriately-coloured materials to form the color filters 122 (G) and 122 (B). Accordingly, color filters 122 (G) and 122 (B) are formed so as to match the position of the organic light-emitting layer 115 (FIGS. 13B and 13C).

Like the color filter 122 (R), the color filters 122 (G) and 122 (B) are each formed along a piece of the BM 123 so as to partly overlap the edges of neighbouring pieces of the BM 123.

The CF substrate 12 is complete when the above steps are complete.

(3) Joining Step

The process of joining the EL substrate 11 and the CF substrate 12 includes a step of dripping resin material for the sealing resin layer onto the joining face (top face) of the EL substrate 11 at a plurality of locations, a step of causing the joining face (top face) of the CF substrate 12 to adhere to the EL substrate 11 having the resin material dripped thereon, and step of curing the resin during adhesion.

While the following describes dripping the resin material onto the EL substrate 11, the resin material may optionally be dripped onto the CF substrate 12.

Figure 14A:
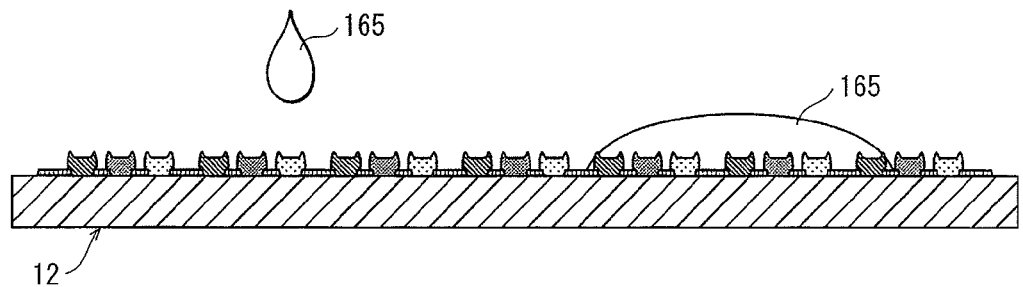
FIGS. 14A through 14C illustrate an example of a joining process.
Figure 14B:
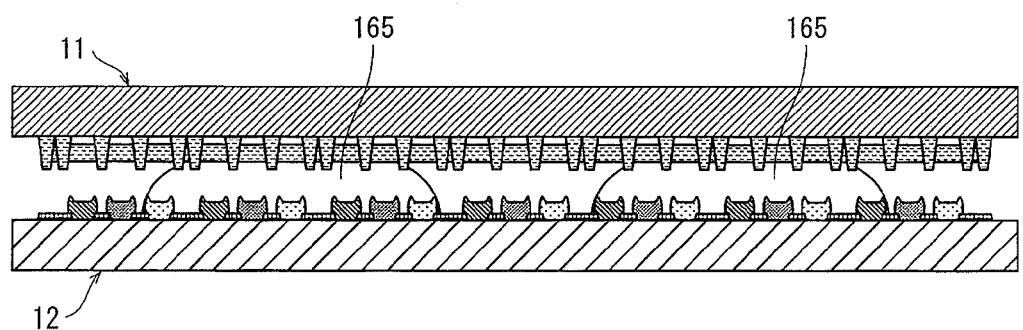
Figure 14C:
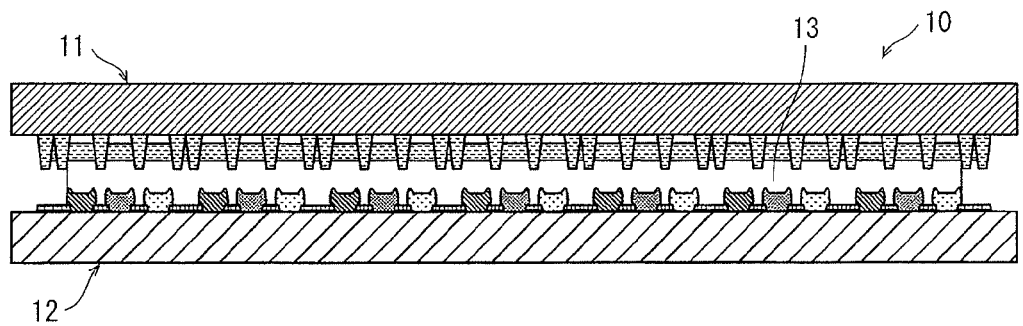

FIGS. 14A through 14C illustrate an example of the joining process.

First, a seal material (i.e., DAM) paste is applied to prevent leakage of the resin material for the sealing resin layer 13 that seals the prepared (i.e., manufactured) EL substrate 11 and the prepared (i.e., manufactured) CF substrate 12. Furthermore, resin material (FILL) 165 for the sealing resin layer 13 is dripped at predetermined space intervals onto interior portions of the CF substrate 12 (i.e., onto portions where the organic light-emitting layer 115 is formed) excluding the circumferential area of the CF substrate 12 (Dripping step, FIG. 14A).

Figure 25:
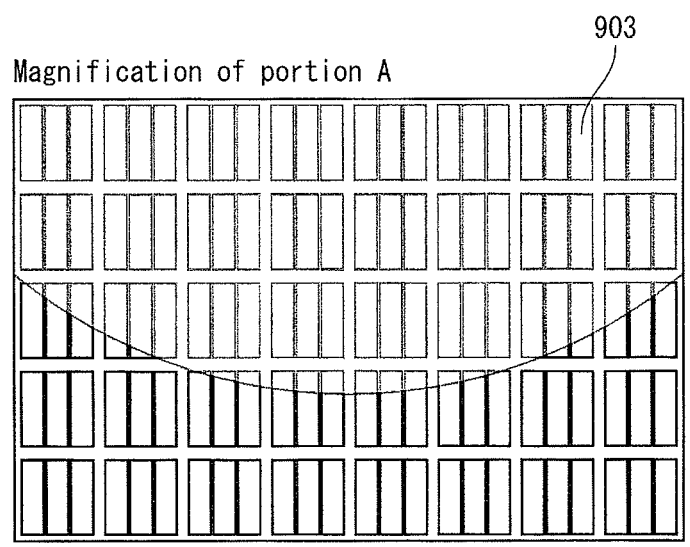
FIG. 25 is a magnified view of portion A of FIG. 24.
Figure 26:
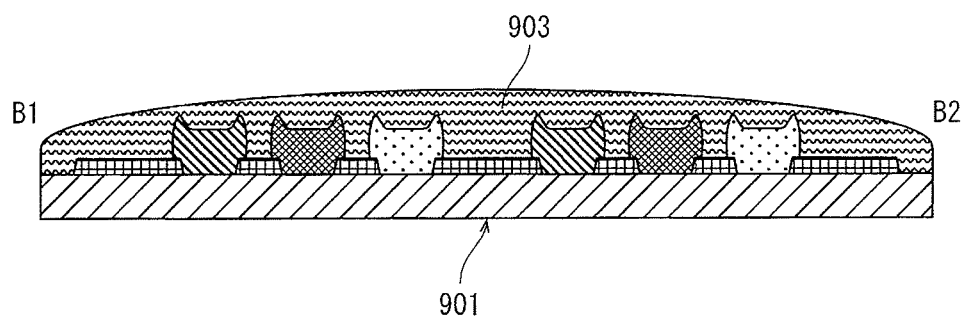
FIG. 26 is a cross-sectional diagram taken along line B1-B2 of FIG. 24.
Figure 27:
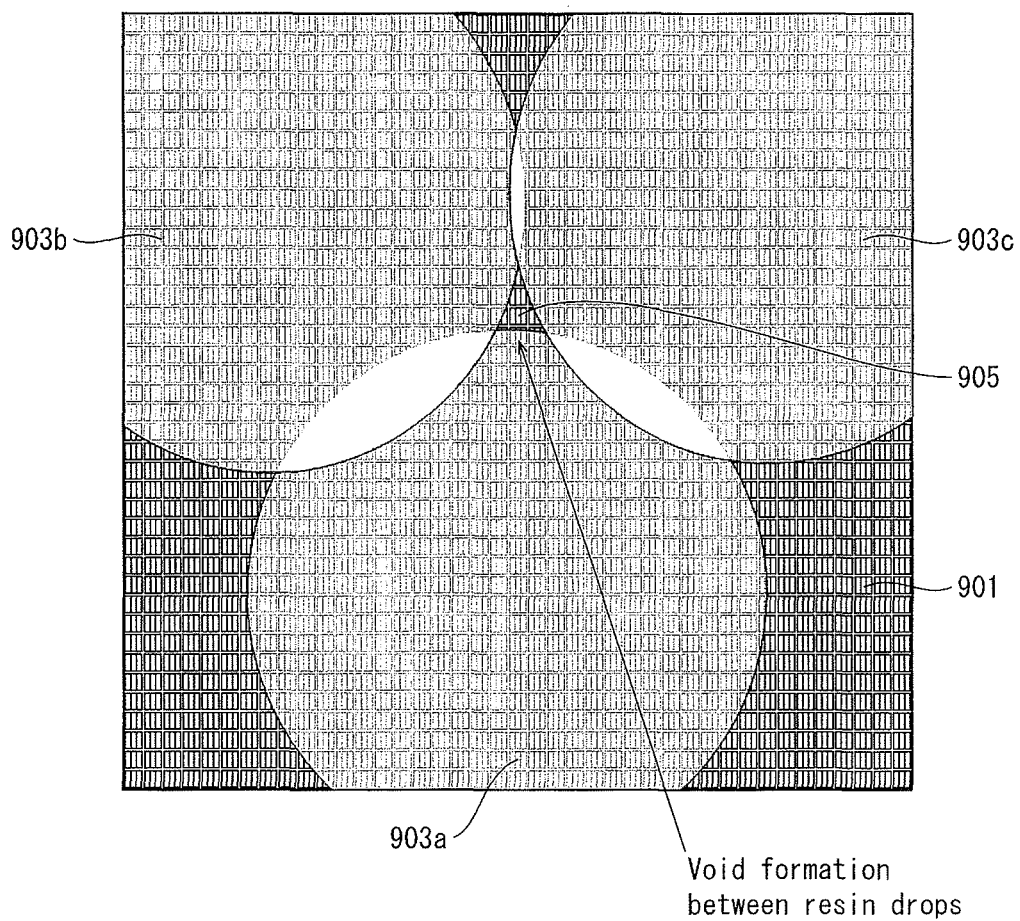
FIG. 27 is a schematic view indicating resin material spread.

Once the dripping of the resin material 165 is complete, the EL substrate 11 and the CF substrate 12 are joined under a vacuum (FIG. 14B). At this point, the resin material 165 so dripped spreads throughout the space between the EL substrate 11 and the CF substrate 12 such that gaps between drops of the resin material 165 are eliminated (see FIGS. 24 and 25).

The resin material 165 is then irradiated with UV rays, for example. Such irradiation may occur while dripping the resin material 165, or may occur once all of the resin material 165 has been dripped. Upon irradiation by the UV rays, resin curing is delayed. While some curing may begin during UV irradiation, most curing progresses after the EL substrate 11 and the CF substrate 12 have been joined.

Then, the resin material 165 is cured once the dripped resin material 165 has sufficiently spread (curing step). Upon curing, the resin material 165 forms the sealing resin layer 13 (FIG. 14C).

The above-described steps complete the display panel 10.

Given the above-described positional relationships between the EL substrate 11 and the CF substrate 12, any voids formed in the sealing resin layer 13 are likely to occur over the inter-pixel BM 123b.

4. Embodiment (1) Materials
(1-1) TFT Substrate

The TFT substrate 111 is made up of a main substrate on which are formed a TFT, a wiring member, a passivation membrane covering the TFT, and so on (none diagrammed).

The main substrate is, for example, made of an insulating material such as a non-alkali glass, a soda glass, a non-fluorescent glass, a phosphoric glass, a boric gas, quartz, an acrylic resin, a styrene resin, a polycarbonate resin, an epoxy resin, a polyethylene resin, a polyester resin, a silicone resin, aluminium oxide, and so on. The main substrate may optionally be an organic resin film.

The inter-layer insulating membrane 112 is, for example, made of an insulating material such as polyimide resin or acrylic resin.

(1-2) Anodes and Auxiliary Electrodes

The anodes 113a and the auxiliary electrodes 113b are metallic wiring made of, for example, Al (aluminium) or an Al alloy.

The anodes 113a may optionally be formed from Ag (silver), an alloy of Ag, Pd (palladium), and Cu (copper), an alloy of Ag, Rb (rubidium), and Au (gold), MoCr (an alloy of molybdenum (Mo) and chromium (Cr)), NiCr (an alloy of nickel (Ni) and Cr), or similar.

Given that a top emission panel is used as the display panel 10 of the exemplary Embodiment, the anodes 113a are beneficially formed of a material having high reflectivity.

(1-3) Banks

The banks 114 are formed from insulating material. Specifically, the banks are formed from a resin or a similar organic material. For example, the organic material may be an acrylic resin, a polyimide resin, a novolac-type phenol resin, and so on. The bank 114 are beneficially resistant to organic solvents.

Further, processes such as etching and baking are applied to the banks 114. Consequently, a material with high resistance to deformity and transformation under these processes is desirable.

(1-4) Organic Light-Emitting Layer

The organic light-emitting layer 115 is, for example, beneficially formed from a fluorescent material as recited in Japanese Patent Application No. H5-163488, such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone and azaquinolone compound, a pyrazoline and pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, an 8-hydroxyquinoline compound metal complex, a 2-bipyridine compound metal complex, a Schiff base and group 3 metal complex, an oxine metal complex, and a rare earth metal complex.

(1-5) Cathode

A transparent electrode is used as the cathode 116. Specifically, the cathode is ITO (indium tin oxide), IZO (indium zinc oxide), or similar. As described above, the display panel 10 is a top-emission panel. As such, the cathode 116 is beneficially formed of a transparent material.

(1-6) Sealing Layer

The sealing layer 117 is, for example, formed from SiO (silicon monoxide), SiN (silicon mononitride), SiON (silicon oxynitride), SiC (silicon carbide), MN (aluminium nitride), $Al_2O_3$ (aluminium oxide), or similar. The display panel 10 is a top emission panel. As such, the sealing layer 117 is beneficially formed from a transparent material.

(1-7) Substrate Body (CF Substrate)

The substrate body 121 of the CF substrate 12 is, for example, made of a material identical to that used for the main substrate of the above-described TFT substrate 111. Optionally, a material different from that used for the main substrate of the TFT substrate 111 may be used. However, given that the display panel 10 is a top emission panel, a material of advantageous transparency is beneficial.

(1-8) Color Filters

The color filters 122 are each made of a known resin material through which visible light, at wavelengths respectively corresponding to red, green, and blue, is able to pass, such as a polyimide resin.

(1-9) BM

The BM 123 is, for example, made from a UV-curable resin material that includes a black pigment with superb light-absorbing and light-blocking characteristics. Acrylic resin or similar is optionally usable as the UV-curable resin material.

(1-10) Sealing Resin Layer

The sealing resin layer 13 is made of various transparent resin materials. Specifically, an epoxy resin or a silicone resin is selected so as to have a pre-curing viscosity adjusted in consideration of the resin material spread and adhesiveness. The viscosity is beneficially in a range of 50 mmPa·s to 1000 mmPa·s, in particular, in a range of 100 mmPa·s to 500 mmPa·s.

(2) Irregularities (2-1) EL Substrate (See FIG. 4)

As described above, the surface of the EL substrate 11 features irregularities. The irregularities encompass protrusions with respect to the bottom of the concavities, concavities with respect to the top faces of the protrusions, and a combination of protrusions and recesses with respect to a position between the bottom of the concavities and the top faces of the protrusions.

Here, with respect to the surface above any position between pixels 30, the concavities 118 and 119 are located between the banks 114. The concavities 118 and 119 have a depth Del of 1.0 μm. Needless to say, with respect to the position on the EL substrate 11 nearest the TFT substrate 111 (i.e., the bottom surface between the banks 114), any portions corresponding to the banks 114 are protrusions having a height of 1.0 μm.

(2-2) CF Substrate (See FIGS. 6 and 7)

In the exemplary Embodiment, the color filters 122 (R), 122 (G), and 122 (B) each have a membrane thickness t1 of 2.5 μm, the membranes of each color having a uniform thickness.

The BM 123 has a membrane thickness t2 of 1.0 μm, invariant across the inter-subpixel BM 123a and the inter-pixel BM 123b.

Accordingly, with respect to the surface of the BM 123 (identical across the inter-subpixel BM 123a and the inter-pixel BM 123b), the irregularities in the CF substrate 12 are protrusions in the form of the color filters 122 having a height H1 of 1.5 μm.

(2-3) Distance

The distance between the EL substrate 11 and the CF substrate 12 in the exemplary Embodiment is described below.

Distance D1 between the bottom of the primary concavities 118 between the banks 114 on the EL substrate 11 and the top faces of the color filters 122 of the CF substrate 12 is 10.00 μm. Here, the height of the color filters 122 and the depth of the concavities between the banks 114 are independent of color emitted, such that distance D1 is invariant for all emitted colours.

Distance D2 between the inter-pixel surface of the EL substrate 11 and the inter-pixel opposing surface of the CF substrate 12 is 10.50 μm. Further, distance D3 between the bottom of the secondary concavity 119 at the approximate midpoint of the inter-pixel area and the surface of the inter-pixel BM 123b of the CF substrate 12 is 11.50 μm.

In this example, distance D3 is the greatest of the distances between the EL substrate 11 and the CF substrate 12.

(3) Manufacturing Process

As described above, the resin material for the sealing resin layer 13 has a viscosity of 500 mmPa·s. The resin material is dripped using a syringe, for example. Each drop of resin material so dripped has sufficient volume to cover approximately 100 of the pixels 30. The number of drops so dripped is dependent on the size of the display panel 10.

The resin material is dripped in a zigzag pattern. That is, when dripping is performed in a matrix, for example, the drip positions on two neighbouring rows are offset by a half-pitch in the row direction.

UV rays irradiate the dripped or dripping resin material, for example. Here, a resin material is used in which curing is delayed upon UV irradiation. Therefore, resin material solidification progresses little before and after the joining of the EL substrate 11 and the CF substrate 12, such that the resin material flows into the gaps between the EL substrate 11 and the CF substrate 12.

Once the resin material has filled the gaps between the EL substrate 11 and the CF substrate 12 (alternatively, once an expected time for the resin material to fill the gap has elapsed), heat is applied to encourage solidification of the resin material. The display panel 10 is complete once the resin material has hardened.

5. Resin Material Fluidity (1) Overview

As described under the Technical Field and Summary headings, the problem of void formation within the sealing resin layer was observed. Upon investigation of void formation positions and the like, it was discovered that void formation occurs in specific places.

First, in conformity with the resin material dripping pattern, void formation was found to occur regularly at positions most distant from the dripping points. Second, the voids were found to be concentrated in portions of specific colours.

Upon detailed investigation into several membrane thickness variations for each color, R, G, and B, of the color filters, it was found that the shape of the irregularities in the CF substrate had a major influence. That is, the ease of spreading (i.e., the fluidity) of the resin material when the EL substrate 11 and the CF substrate 12 are joined is influenced by the degree to which the color filters protrude (i.e., by the size of the gaps between the EL substrate 11 and the CF substrate 12).

This influence is greater than that of wettability in the surfaces of the EL substrate 11 and the CF substrate 12, and is not constrained by the presence of pigments or dyes in the color filters.

(2) Experiment

The following uses the results of an experiment in which the irregularities in the CF substrate 12 are varied to describe the separation of the EL substrate 11 and the CF substrate 12, and the fluidity of the resin material used for the sealing resin layer 13.

Figure 15A:
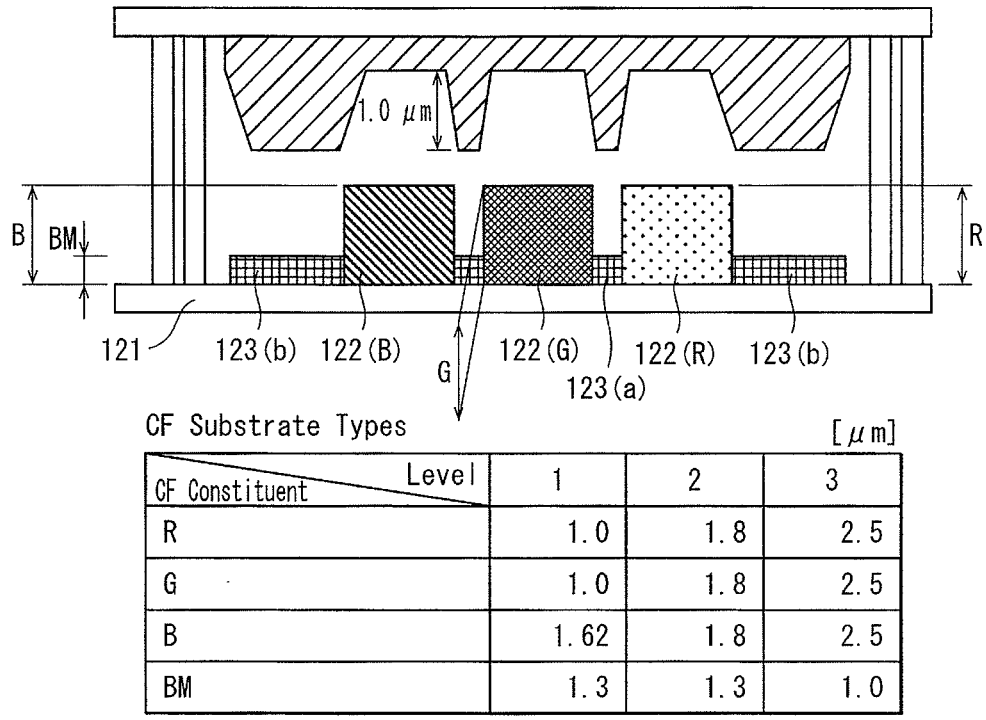
FIGS. 15A and 15B illustrate the synopsis of an experiment, where
Figure 15B:
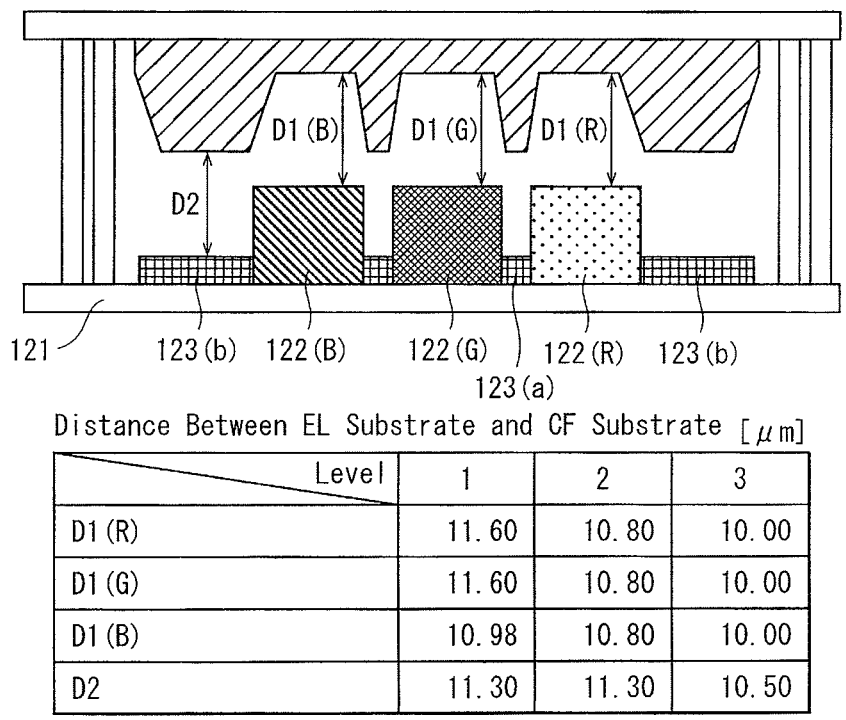

FIGS. 15A and 15B illustrate the overall experiment. FIG. 15A illustrates the irregularities of the EL substrate and the CF substrate, while FIG. 15B illustrates the distance between the EL substrate and the CF substrate.

As shown, the experiment was performed in three configurations. The irregularities in the EL substrate 11 were held constant, while three levels on the CF substrate 12 were investigated.

The EL substrate 11 used in the experiment was made concave to correspond with the color filters 122 on the CF substrate 12, i.e., to assume the primary concavities 118 between the banks 114. The concavity depth was of 1 µm.

Conversely, on the CF substrate 12 used in the experiment, the BM 123 had the height given as BM, the blue color filter 122 (B) had the height given as B, the green color filter 122 (G) had the height given as G, and the red color filter 122 (R) had the height given as R, all heights being measured with respect to the substrate body 121 and indicated in FIG. 15A. The heights in the experiment are shown in the table at the bottom of FIG. 15B.

For reference purposes, the following describes the membrane thickness of conventional color filters 122 and BM (the conventional numbers being given as level 1 in the table at the bottom of FIG. 15A).

The membrane thickness of the color filters 122 was determined according to the (type of) sub-pixel. For example, the membrane thickness of color filter 122 (B) was 1.62 µm, whereas the membrane thickness of color filters 122 (G) and 122 (R) was of 1.0 µm. The membrane thickness often varies by color.

For example, given a membrane thickness of 1.3 µm for the BM 123, then with respect to the top surface of the BM 123, color filter 122 (B) protruded by 0.32 µm whereas color filters 122 (G) and 122 (R) were recessed by 0.3 µm.

As given in FIG. 15B, distances D1 and D2 between the EL substrate 11 and the CF substrate 12 were found using the above-given levels 1 through 3 of the CF substrate.

Specifically, for level 1, distances D1 (R) and D1 (G) were 11.60 µm, distance D1 (B) was 10.98 µm, and distance D2 was 11.30 µm. Distances D1 (R) and D1 (G) in the pixel areas are each greater than distance D2 in the non-pixel areas.

At level 2, distances D1 (R), D1 (G), and D1 (B) were identical at 10.80 µm, and distance D2 was 11.30 µm. As such, distance D2 in non-pixel areas where sub-pixels are not formed (i.e., in the inter-pixel areas) was greater than distances D1 (R), D1 (G), and D1 (B) in the pixel areas.

At level 3, distances D1 (R), D1 (G), and D1 (B) were identical at 10.00 µm, and distance D2 was 10.50 µm. As such, distance D2 in non-pixel areas where sub-pixels are not formed (i.e., in the inter-pixel areas) was greater than distances D1 (R), D1 (G), and D1 (B) in the pixel areas.

In the pixel areas, distance D1 was 10.00 µm for level 3 and was 10.80 µm for level 2. That is, distance D1 was smaller for level 3 than for level 2.

(2-1) Void Quantity

Figure 16:
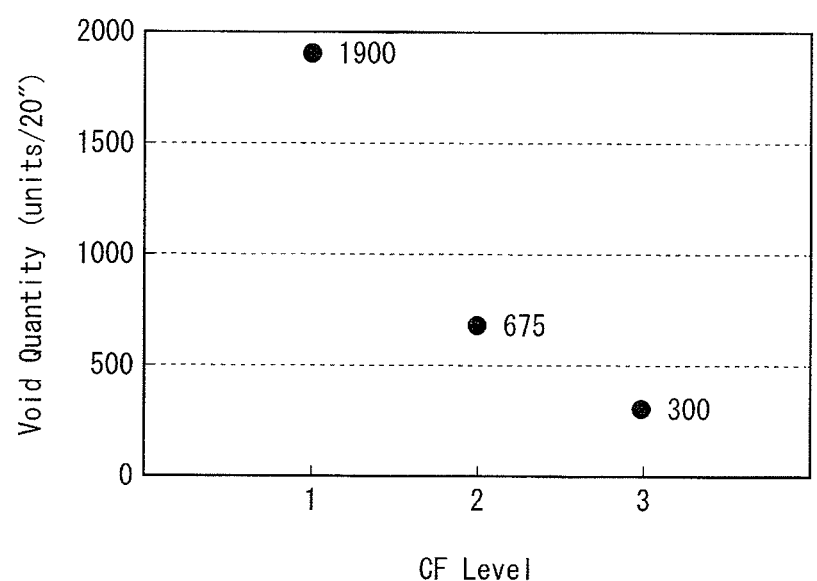
FIG. 16 indicates void quantity per 20-inch area.

FIG. 16 illustrates the void quantity per 20-inch area.

Using the three configurations (levels 1, 2, and 3) of the CF substrate 12 described above, an investigation was performed to examine the void quantity occurring in the sealing resin layer 13 when the resin material 165 is dripped in the manner used for actual manufacturing and the EL substrate 11 and the CF substrate 12 are subsequently joined. This investigation was performed on a display panel 10 having a screen size of 20 inches.

As shown in FIG. 16, the void quantity decreased across levels, such that a ranking in decreasing order of void quantity gives the order level 1, level 2, level 3. This observation is thought to be influenced by such factors as the size relationship between distance D1 and distance D2 at each level, as well as the magnitude of distance D1 itself.

Comparing level 1 to level 2 revealed that, as stated above, fewer voids were present at level 2 than at level 1. That is, void formation is less likely to occur at level 2 than at level 1.

Comparing the configurations of level 1 and level 2 revealed that, at level 1, only distance D1 (B) is smaller than distance D2, while at level 2, distances D1 (R), D1 (G), and D1 (B) are all smaller than distance D2. Also, distance D1 is smaller at level 2 than at level 1.

Accordingly, it can be concluded that void formation is less likely when all distances D1 are as small as possible, specifically when all distances D1 are smaller than distance D2.

Comparing level 2 to level 3 revealed that, as stated above, fewer voids were present at level 3 than at level 2. That is, void formation is less likely to occur at level 3 than at level 2.

Comparing the configurations of level 2 and level 3 revealed that on both levels, distances D1 (R), D1 (G), and D1 (B) were all smaller than distance D2, and that all distances D1 were smaller at level 3 than at level 2.

Accordingly, as described in the above comparison of level 1 and level 2, it can be concluded that void formation is less likely when all distances D1 are smaller than distance D2, and all distances D1 are small.

To summarise the above findings, void formation becomes less likely as distances D1 are made smaller than distance D2, and as the gap (distance) between the EL substrate 11 and the CF substrate 12 is made smaller.

(2-2) Formation Position

Figure 17A:
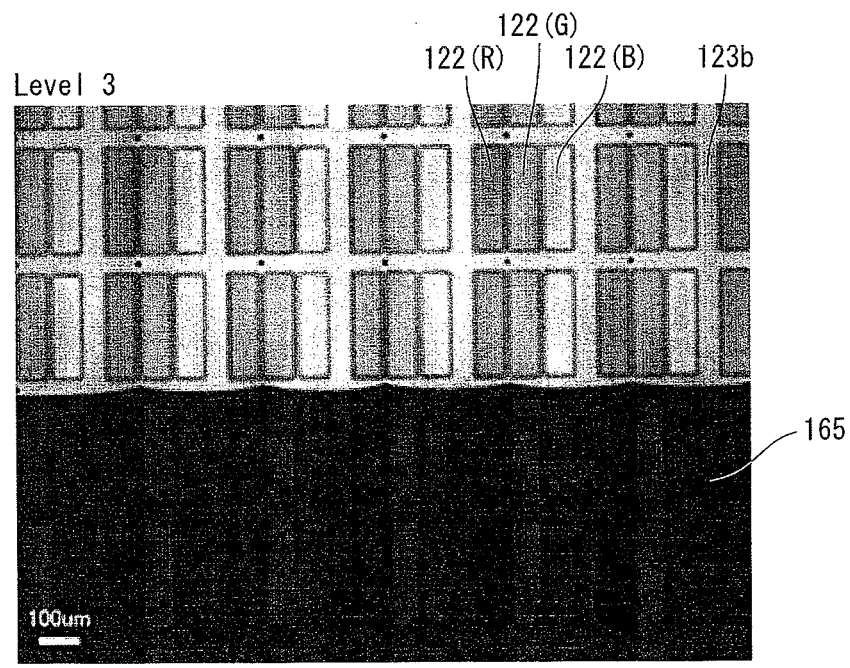
FIGS. 17A and 17B illustrate resin material fluidity in the experiment, where
Figure 17B:
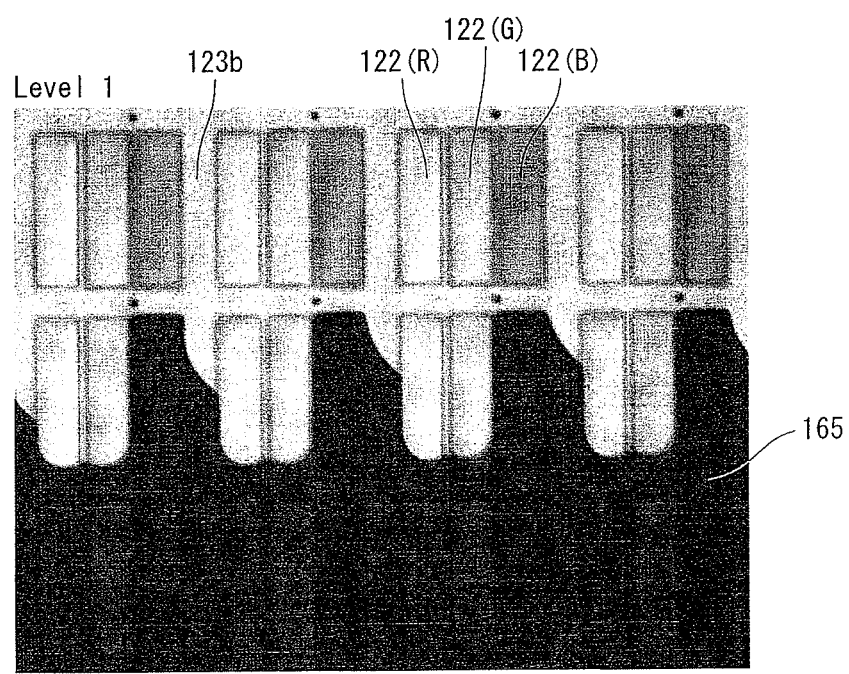
Figure 18A:
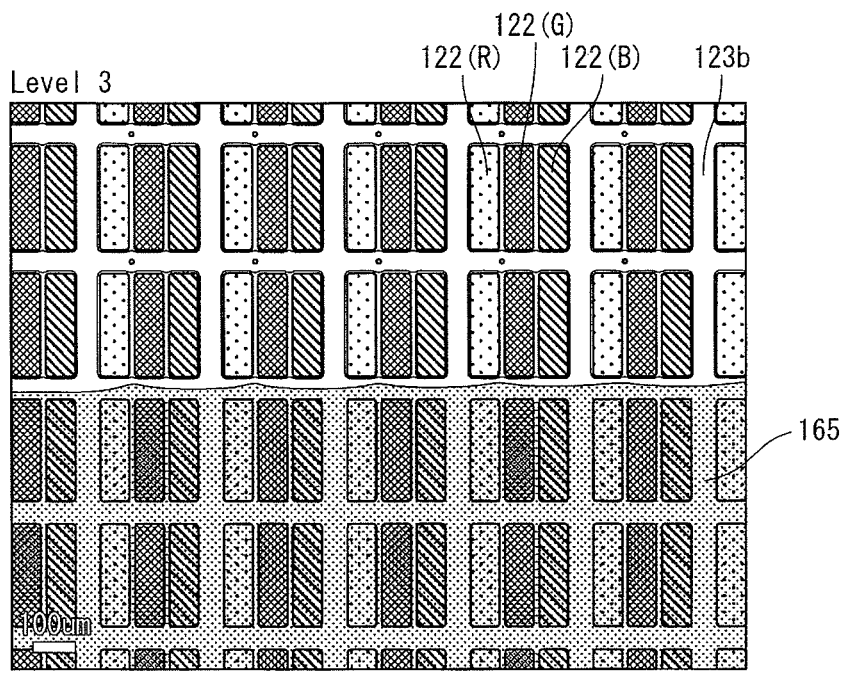
FIGS. 18A and 18B are trace diagrams produced from FIGS. 17A and 17B, where
Figure 18B:
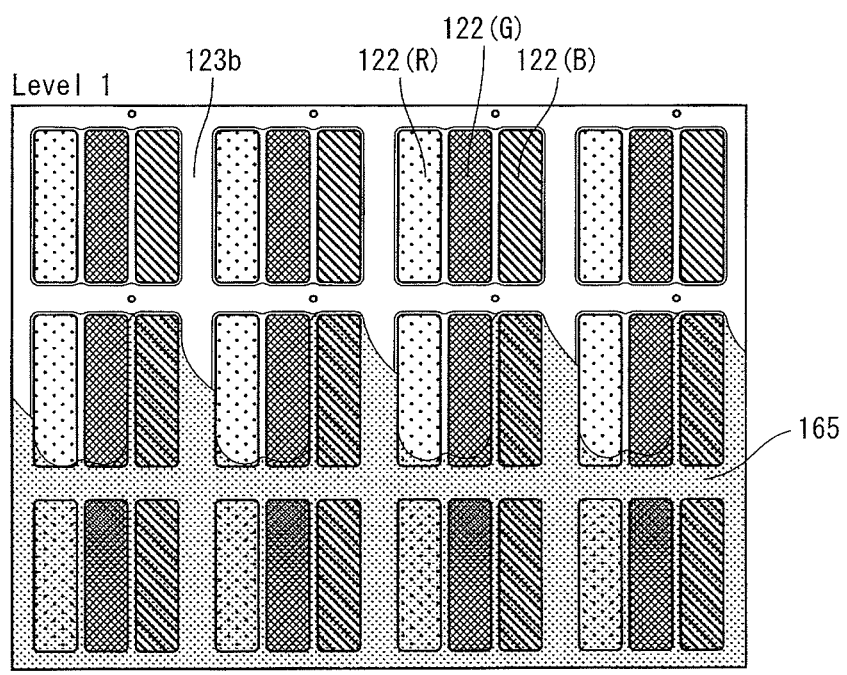

FIGS. 17A and 17B illustrate the fluidity of the resin material in the above-discussed experiment. FIG. 17A is given using level 3 of the CF substrate, while FIG. 17B is given using level 1 of the CF substrate. FIGS. 18A and 18B are trace diagrams produced from FIGS. 17A and 17B. FIG. 18A is given using level 3 of the CF substrate, while FIG. 18B is given using level 1 of the CF substrate.

As shown in FIGS. 17A, 17B, 18A, and 18B, and as confirmed at level 3, the resin material 165 (black side) was fluid enough to evenly spread over a plurality of pixel areas, and to flow evenly over a given pixel area. This is due to the sub-pixel positions, i.e., the distance between the EL substrate 11 and the CF substrate 12 at each color filter, being uniform and narrow.

As conversely confirmed, at level 1, although the resin material 165 (black side) flowed in a similar pattern over individual pixels (areas), at the pixel (area) level, the resin material 165 flowed (spread) between the blue color filter 122 (B) and the EL substrate 11 as well as between the BM 123b and the EL substrate 11, flow was more difficult between the red color filter 122 (R) and the EL substrate 11 as well as between the green color filter 122 (G) and the EL substrate 11.

At level 1, the difference between the fluidity of the resin material 165 at the blue color filter 122 (B) and the BM 123b and the fluidity of the resin material 165 at the red color filter 122 (R) and the green color filter 122 (G) lay in the distance between the EL substrate 11 and the CF substrate 12. Specifically, the resin material fluidity was worse at the color filter 122 (R) and the color filter 122 (G), where the distance was large.

As confirmed by the above, the fluidity of the resin material 165 worsened as the distance between the EL substrate 11 and the CF substrate 12 increased, but improved at level 3. The conclusion that a configuration where void formation in the sealing resin layer 13 was less likely to occur was thus reached.

Figure 19A:
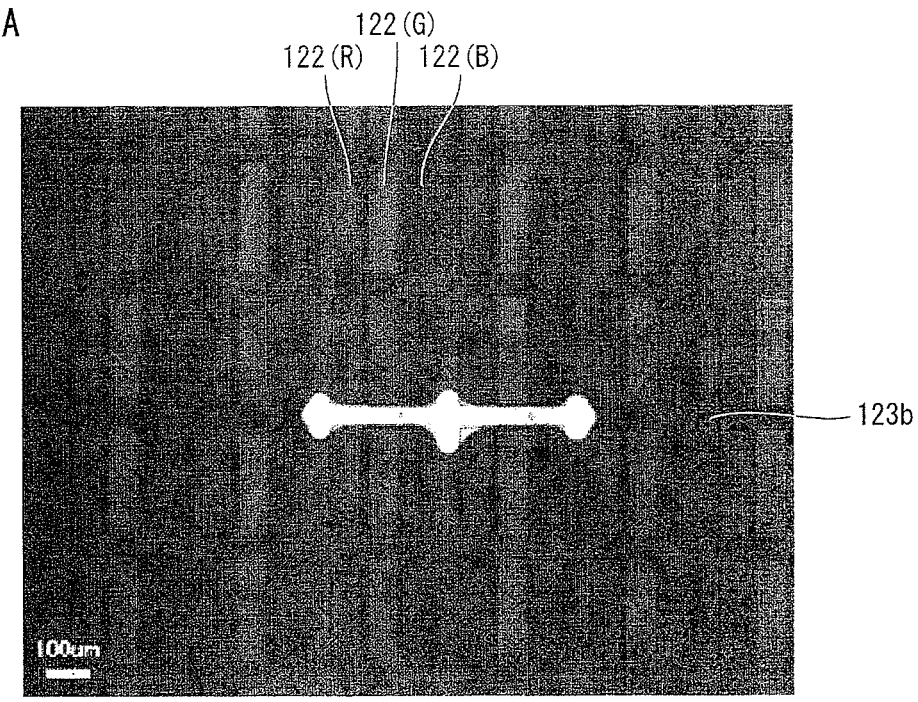
FIGS. 19A and 19B illustrate void formation positions at level 3.
Figure 19B:
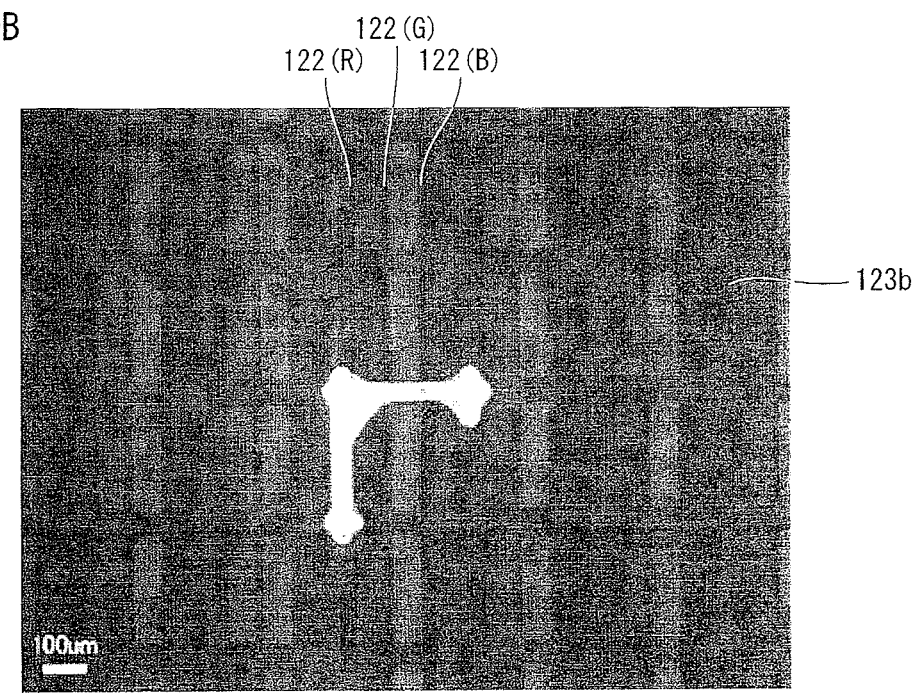
Figure 20A:
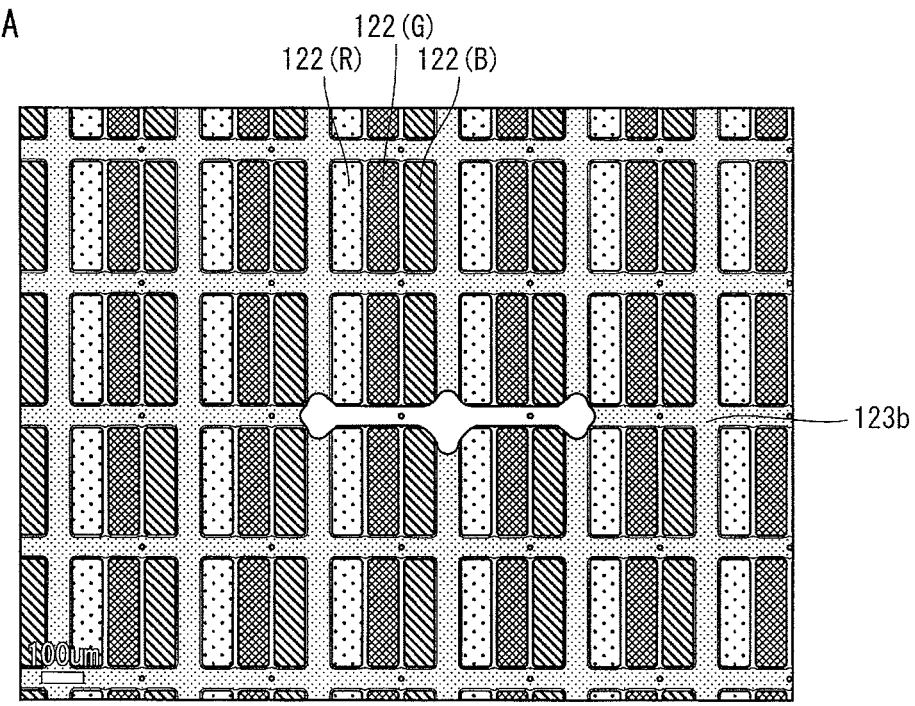
FIGS. 20A and 20B are traced versions of FIGS. 19A and 19B.
Figure 20B:
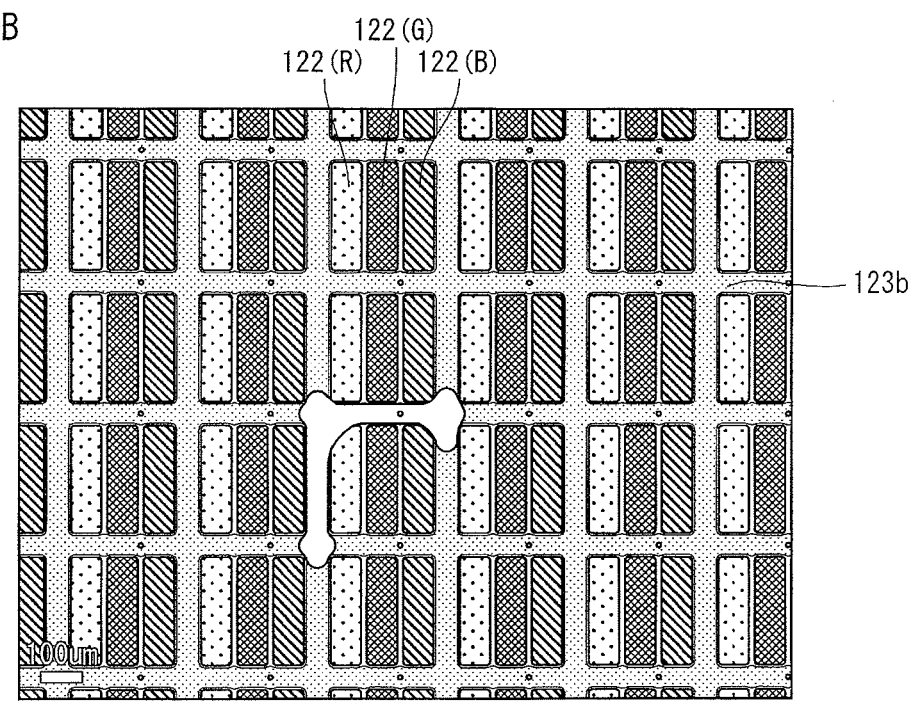
Figure 21A:
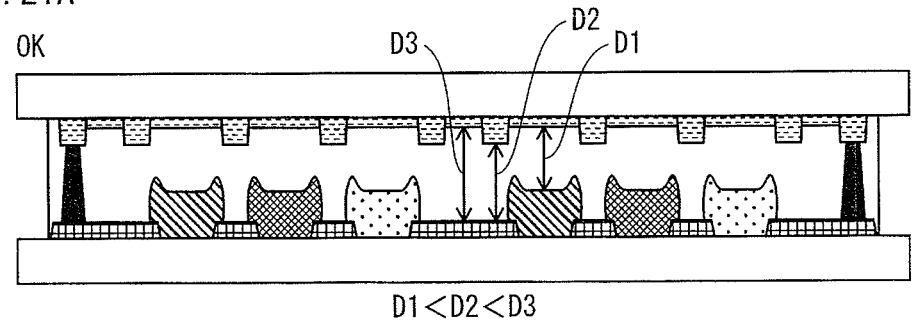
FIGS. 21A through 21D illustrate the relationship of void formation to the distance between the EL substrate and the CF substrate.
Figure 21B:
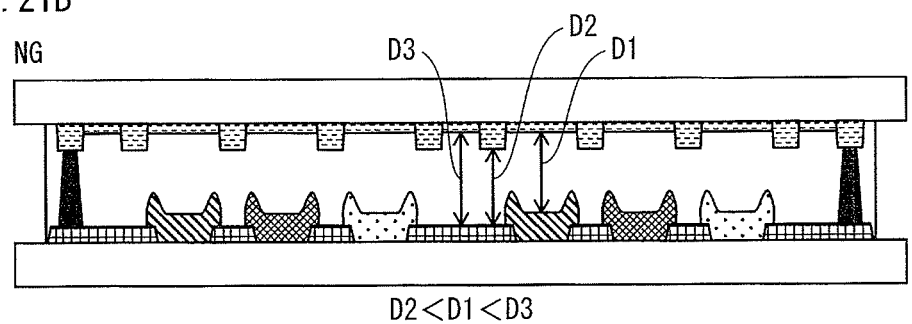
Figure 21C:
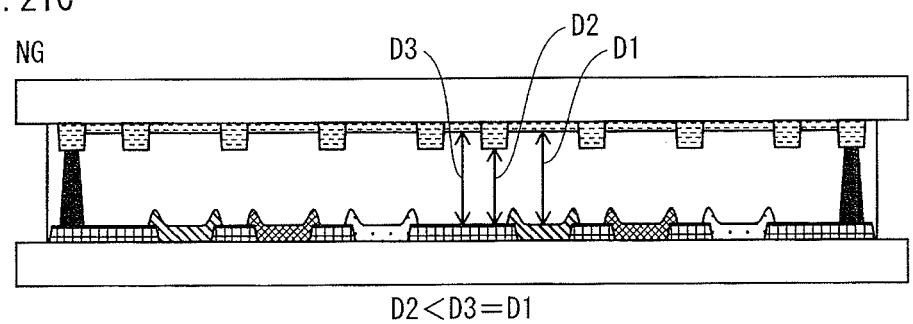
Figure 21D:
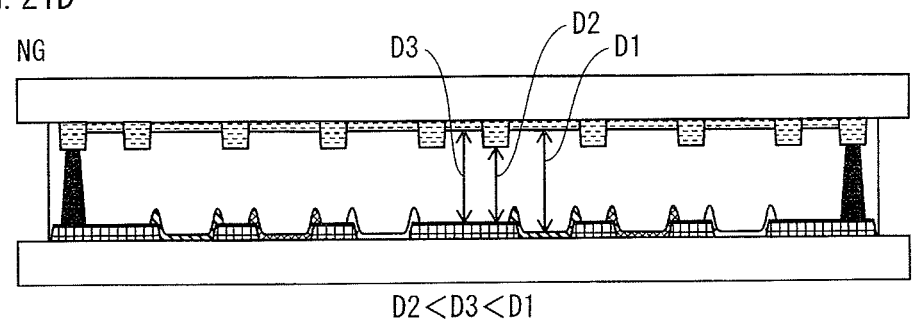

FIGS. 19A and 19B illustrate void formation positions at level 3. FIGS. 20A and 20B are traced versions of FIGS. 19A and 19B.

As shown, void formation occurred at level 3 in the inter-pixel area. That is, in FIGS. 19A and 20A, a void has formed so as to extend horizontally between pixels, and in FIGS. 19B and 20B, a void has formed along (two sides of) the perimeter of a pixel.

At level 3, the inter-pixel BM 123b was formed between pixels. The distance (D2) between the inter-pixel BM 123b and the EL substrate 11 was greater than the distance (D1) between the top surface of the color filters 122 and the primary concavity 118 on the substrate 11. Thus, the resin material fluidity worsened in the corresponding inter-pixel area, leading to void formation.

That is, void formation is constrained by optimizing the distance between the EL substrate 11 and the CF substrate 12. Further, adjusting the size of the distance between the EL substrate 11 and the CF substrate 12 (i.e., the separation) by parts enables the designation of specific void formation positions.

(3) Discussion
(3-1) Distances

As confirmed by the above-described experiment, resin material fluidity worsens with increasing distance between the EL substrate and the CF substrate, and where variations in the distance between the EL substrate and the CF substrate are present, small (narrower) distances lead to more desirable resin material fluidity than large (wider) distances.

Accordingly, the following discussion concerning the distance between the EL substrate and the CF substrate is possible.

FIGS. 21A through 21D illustrate the relationship of void formation to the distance between the EL substrate and the CF substrate.

The D1, D2, and D3 indicated correspond to those given by FIGS. 9 and 15B.

$$D1 < D2 < D3 \quad \text{(a) Case A:}$$

In this example, the resin material flows easily in the region at D1, where the distance is smallest, and void formation is unlikely in this region (i.e., between pixel areas).

Specifically, the organic light-emitting layer is located in the region at D1. The exposure of the organic light-emitting layer of water, oxygen, and so on is thus preventable.

Also, D2 is greater than D1, and D3 is greater than D2. Therefore, resin material fluidity is worse in the region at D2 than in the region at D1, and is still worse in the region at D3 than in the region at D2.

Accordingly, void formation is less likely at D1 and more likely at D3. The region at D3 is positioned at the approximate midpoint of the inter-pixel area. Given the absence of organic light-emitting layers in this region, void formation in the region at D3 has less effect on the organic light-emitting layers than void formation in the pixel areas where the organic light-emitting layers are present.

Accordingly, a relationship of:

$$D1 < D2 < D3$$

is plausibly the most beneficial.

$$D2 < D1 < D3 \quad \text{(b) Case B:}$$

In this example, given that D1, in the pixel area, is greater than D2, in the inter-pixel area, the resin material flows less easily in the region at D1, and void formation is more likely therein.

Accordingly, a relationship of:

$$D2 < D1 < D3$$

appears to be non-beneficial.

$$D2 < D3 = D1 \quad \text{(c) Case C:}$$

In this example, the resin material flows easily in the region at D2, where the distance is smallest, and void formation is unlikely therein.

However, D1, in the pixel areas having the organic light-emitting layers, is equal to D3, at the inter-pixel areas not having the organic light-emitting layers. Thus, void formation occurs with equal ease in the region at D1 and in the region at D3. That is, void formation is equally likely in the region at D1 and in the region at D3.

Accordingly, a relationship of:

$$D2 < D3 = D1$$

appears to be non-beneficial.

$$D2 < D3 < D1 \quad \text{(d) Case D:}$$

In this example, the distance between the EL substrate 11 and the CF substrate 12 is greatest at D1, in the pixel area having the organic light-emitting layer. Void formation is thus most likely in this region.

Accordingly, a relationship of:

$$D2 < D3 < D1$$

appears to be non-beneficial.

(3-2) BM Width

The exemplary Embodiment focuses on the distance between the EL substrate and the CF substrate.

Here, as shown for example in FIG. 9, the distance between the surface of the CF substrate 12 (which is the top surface of the inter-subpixel BM 123a) and the surface of the EL substrate 11 at a position above one of the banks 114 is equal to distance D2 between the inter-pixel surface of the EL substrate 11 (the surface above the banks 114a) and the inter-pixel opposing surface of the CF substrate 12. Simply considering the distance between the EL substrate 11 and the CF substrate 12, void formation is likely to occur in the portion corresponding to the top of the inter-subpixel BM 123a between the pixel areas.

However, the distance between the color filters 122 in the pixel areas is, for example, distance B2 between color filter 122 (B) and color filter 122 (G) (see FIG. 9), which is on the order of 3 μm to 8 μm. As such, when distance B2 is, for example, 5 μm, and thus small in comparison to distance D1 between the EL substrate 11 and the color filters 122 on the CF substrate 12, then, considering the fact that the fluidity of the resin material increases with narrowing distance, there is no need to account for the distance between the CF substrate 12 and the EL substrate 11 between the color filters 122.

For reference, when the ratio of the distance between the color filters 122 to distance D1 between the CF substrate 12 and the EL substrate 11 is 1.0 or lower, the distance between the CF substrate 12 and the EL substrate 11 between the color filters 122 is plausibly ignorable, even if greater than distance D1.

On the other hand, when the distance between pixels (distance B1 in FIG. 9) is small in comparison to distance D1 and thus similar to the distance between neighbouring color filters 122 in the pixel areas, void formation becomes difficult to suppress in the pixel area despite distance D2 being greater than distance D1. Accordingly, void formation in the pixel areas is constrainable by setting distance D1 between the CF substrate 12 and the EL substrate 11 to be, for example, on the order of 5 μm or greater, which further improves the likelihood that any voids formed are located in the inter-pixel areas.

Reasoning Leading to Invention

The present inventors examined the causes of void formation in the sealing resin layer between the EL substrate and the CF substrate, and thus came to the following understanding.

Specifically, when the resin material used for sealing spreads in concentric circles, void formation does not occur in areas near the center of the concentric circles, but does occur in peripheral regions farther away from the center. Regions exist where the resin material spreading in concentric circles from the center of a given drip position (termed a first drip position) and the resin material spreading in concentric circles from the center of another drip position (termed a second drip position) neighbouring the first drip position do not overlap, as regional overlap is not perfect. Void formation then occurs in these non-overlapping regions.

Furthermore, during the analysis of void formation locations, the existence of environments more or less conducive to the spread of the resin material in concentric circles progressing with increasing distance from the center of the concentric circles (i.e., void formation does not occur in progress-conducive environments, but does occur in non-conducive environments) was determined.

When viewed in cross-section, the EL substrate has banks facing the CF substrate, and the sub-pixels are formed between the banks. Accordingly, the surface of the EL substrate has irregularities.

When viewed in cross-section, the CF substrate has BM on the surface thereof serving as the banks between the filters of each color, and these color filters are correspondingly formed between the BM. Accordingly, the surface of the CF substrate has irregularities.

Given that the sub-pixels are formed on the EL substrate between the banks, the sub-pixels are located in the concavities between the banks. Conversely, the color filters on the CF substrate are located opposite the sub-pixels on the EL substrate.

Upon critically examining and analyzing the relationship between the depth of the concavities where the sub-pixels are located between the banks on the EL substrate and the height of the color filters opposite the sub-pixels of the EL substrate on the CF substrate (including depressions and concavities with respect to the BM surface), the present inventors arrived at the following.

When the color filters on the CF substrate protrude toward the EL substrate relative to the BM surface, there is a tendency toward greater progress by the resin material between the concavities formed between the banks on the EL substrate and the color filters protruding from the substrate body.

In other words, when pressurized between the EL substrate and the CF substrate, the resin material used for sealing spreads into the gaps between the substrates, thereby determining the void locations. While spreading, the resin material is more easily drawn into narrow gaps between the substrates than into wide gaps between the substrates.

In addition, the progress of the resin material into the concavities between the banks on the EL substrate and the color filters protruding from the CF substrate is notably enhanced when the size of the protruding color filters (i.e., the degree of protrusion) is increased while the space between the concavities between the banks on the EL substrate and the color filters protruding from the CF substrate is narrowed and correspondingly made narrower than the space between the sides of the concavities between the banks (the EL substrate banks) and the space between the sides of the protruding color filters (the inter-subpixel BM on the CF substrate). In other words, void formation in the resin layer used for sealing is more easily made to occur in the inter-pixel areas between the EL substrate and the CF substrate, where no pixels are formed.

The reasons are not yet fully clear, but the mechanism is theorized to be similar to capillary action. The present disclosure has thus been reached in light the above-described new findings.

Assuming a mechanism similar to capillary action, the surface of the EL substrate or the surface of the CF substrate is activatable by irradiation under, for example, oxygen plasma or UV rays, prior to the joining of the substrates, in order to promote greater capillary action.

(Variations)

1. EL Substrate (1) Surface Irregularities

Although the exemplary Embodiment describes the surface irregularities of the EL substrate 11 as being caused by the banks 114, the surface of the sealing layer (or encapsulation layer) (117) may optionally be made planar. The planarization of the sealing layer (117) is performable by a planarization process, or by thickening the resin layer (117).

Further, although the portions corresponding to the banks protrude with respect to the bottom of the surrounding concavities, this may be reversed. Optionally, the portions having the banks may, for example, be worked into concavities (such that the surrounding area forms a protrusion with respect to the bank portion).

However, this approach requires that, when the EL substrate opposes the CF substrate, the portion wider than the distance between the space between the banks of the EL substrate and the color filters on the CF substrate is arranged in an area other than the area sandwiched between the banks of the EL substrate and the color filters on the CF substrate.

(2) Banks

In the exemplary Embodiment, each pixel is delimited by two banks. That is, two of the banks 114 are arranged between two neighbouring pixels, one of the banks 114 being located at the side of the organic light-emitting layer (115 (B)) of a given pixel that faces the other pixel, and the other one of the banks 114 being located at the side of the organic light-emitting layer (115 (R)) of the other pixel that faces the given pixel (i.e., the two banks 114 on either side of the auxiliary electrode 113b in FIG. 2).

However, a single bank may optionally be arranged between the pixels, as in the example described in Variation (1). In this example, the reference signs of the exemplary Embodiment are used for elements identical to those described therein.

Figure 22:
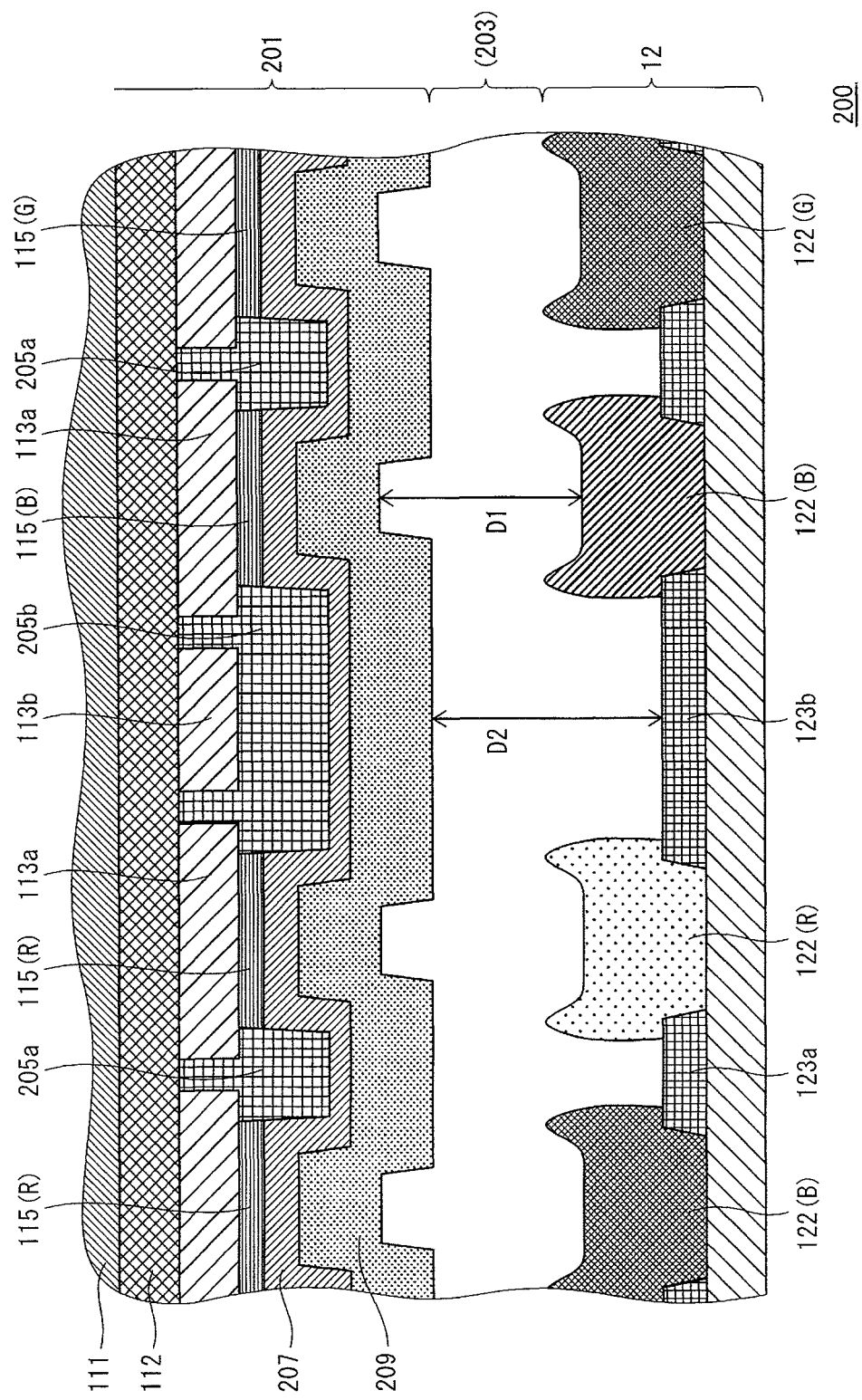
FIG. 22 is a cross-sectional diagram schematically illustrating key components of a display panel pertaining to Variation (1).

FIG. 22 is a cross-sectional diagram schematically illustrating the key components of a display panel 200 pertaining to Variation (1).

The display panel 200 has a sealing resin layer 203 joining an EL substrate 201 and a CF substrate 12.

The EL substrate 201 includes a main substrate (TFT substrate) 111, an inter-layer insulating membrane 112, anodes 113a, auxiliary electrodes 113b, banks 205, an organic light-emitting layer 115, a cathode 207, and a sealing layer 209.

The banks 205 include two varieties, namely inter-subpixel banks 205a arranged between the sub-pixels, and inter-pixel banks 205b arranged between the pixels. The inter-subpixel banks 205a are configured identically to the inter-subpixel banks 114a disposed between the sub-pixels in the exemplary Embodiment.

In Variation (1), a single bank (205b) is arranged between the pixels 30. Thus, the Variation differs from the exemplary Embodiment in that the surface of the portion corresponding to the area between pixels on the CF substrate 12 is flat.

Let the distance between the inter-pixel opposing surface of the CF substrate 12 and the inter-pixel surface of the EL substrate 201 be D2, and let the distance between the sub-pixel surface of the EL substrate 201 and the sub-pixel opposing surface of the CF substrate 12 be D1. The distance between the EL substrate 201 and the CF substrate 12 then satisfies the relation:

$$D1 < D2$$

Accordingly, void formation in the pixel areas having the organic light-emitting layers 115 (i.e., the sub-pixels) is constrainable.

(3) Pixels

In the exemplary Embodiment, the pixels are each made up of three sub-pixels each emitting a different color of light. However, the pixels may optionally be made up of a single sub-pixel.

2. CF Substrate (1) Color Filter Type

In the exemplary Embodiment, three types of color filters are discussed, namely red (R), green (G), and blue (B). However, no particular limitation is intended. For example, yellow (Y) may be optionally added for a total of four types, or the color filters may be optionally omitted for a monochrome result.

When the wavelengths of the light emitted by the organic light-emitting layer do not require color selection by color filter, then no color filter is required on the CF substrate opposite thereto. In such circumstances, the opposing substrate is configured to be transparent, and this transparent substrate is shaped to have a surface corresponding to the shape of the irregularities in the substrate having the sub-pixels. Thus, the transparent substrate is equivalent to the CF substrate of the exemplary Embodiment.

(2) Color Filter Locations

In the exemplary Embodiment, a uniform location pattern is used for the color filters in the pixel areas. However, the location pattern may optionally vary with each pixel area.

Furthermore, in the exemplary Embodiment, one of each of three types of color filter 122 are used for each individual pixel. However, a plurality of (e.g., two) predetermined color filters may optionally be used in a given color, for a total of four color filters making up the pixel (in such circumstances, the quantity of sub-pixels is four).

(3) Color Filter Thickness

In the exemplary Embodiment, the membrane thickness of the color filters 122 is uniform, irrespective of the color emitted thereby. However, the thickness of the color filters 122 may optionally vary. Nevertheless, distances D1 (R), D1 (G), and D1 (B) between the respective top faces of the color filters 122 (i.e., the sub-pixel opposing surfaces) and the top surface of the sub-pixels on the EL substrate 11 or 201 are beneficially smaller than distance D2 between the inter-pixel areas on the EL substrate 11 or 201 and the CF substrate 12.

Portions of the EL substrate 11 or 201 opposite the color filters 122 (i.e., the sub-pixel surface) may, with respect to the inter-pixel surface of the EL substrate 11 or 201, optionally be recessed, protrude, or be recessed and protrude to a degree varying according to the corresponding color filter, for example.

When distance D1 between the CF substrate and the EL substrate varies at the color filters, D1 at the central portion of the pixel areas is beneficially narrower than D1 at edge portions of the pixel areas. This is because narrowing distance D1 at the central portion of the pixel area increases the fluidity of the resin material therethrough and minimizes the occurrence of void formation therein. In other words, distance D1 is made narrower at the center portion than at the edge portions to encourage void formation offset toward the edge portions.

That is, given similarly-sized voids forming in the pixel area, an occurrence of void formation so as to extend outside the pixel area and only partially into the pixel area is preferable to an occurrence of void formation occurring entirely within the pixel area in that the former is better able to minimize the effect on the organic light-emitting layer.

3. Display Device

Figure 23:
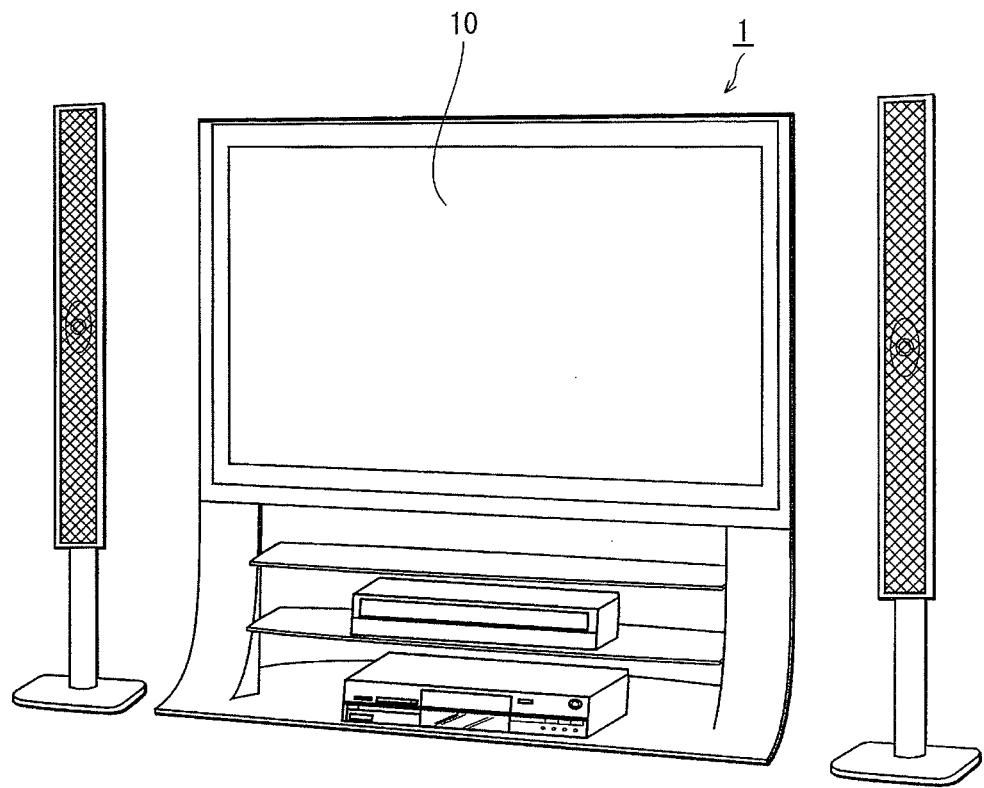
FIG. 23 illustrates the display device that includes the display panel pertaining to the exemplary Embodiment.

FIG. 23 is an overall schematic of the display device pertaining to the present disclosure. The display device 1 includes the above-described display panel 10 serving as the screen portion, as well as speakers, a power ON and OFF switch, and connection terminals for connecting to external speakers, a recorder for recording video, and so on.

4. Other

In the exemplary Embodiment, distance D3 between the EL substrate and the CF substrate is greatest at the approximate midpoint of the inter-pixel area, regardless of the position of the pixels. That is, as shown in FIG. 2, the banks (114a) are formed separately on either side of the auxiliary electrode (113b), and distance D3 is made greater by forming the secondary concavity 119 at the surface of the EL substrate 12 to correspond to the portion between the banks (114a).

However, during investigation, the present inventors determined that the regions most prone to void formation are the regions more distant from the position where the resin material is dripped. Thus, the secondary concavity 119 may optionally be formed so as to increase distance D3 only in the regions particularly prone to void formation. Further, distance D2 may optionally be greater than distance D1 only in regions particular prone to void formation.

INDUSTRIAL APPLICABILITY

The present disclosure is widely applicable to constraining the formation of voids in any portion where a light-emitting element is formed between an element substrate and an opposing substrate.

REFERENCE SIGNS LIST

10 Display panel
11 EL substrate (Element substrate)
12 CF substrate (Opposing substrate)
13 Sealing resin layer
30 Pixels
31 Sub-pixels
118 Primary concavity
119 Secondary concavity
122 Color filter (First protrusion)
123 BM

The invention claimed is:

1. A display panel, comprising:
an element substrate having a plurality of pixels, each pixel having at least one light-emitting element;
an opposing substrate arranged to face the element substrate; and
a sealing resin layer interposed between and adjoining the element substrate and the opposing substrate, respective surfaces of the element substrate and the opposing substrate facing each other, and sealing the light-emitting elements, wherein
an element surface is defined as a top surface of the element substrate on one of the light-emitting elements,
an element-opposing surface is defined as a surface of the opposing substrate that is opposite the element surface,
an inter-pixel surface is defined as a top surface of the element substrate between neighboring pixels,
an inter-pixel opposing surface is defined as a surface of the opposing substrate opposite the inter-pixel surface,
an inter-element surface is defined as a top surface of the element substrate between neighboring light-emitting elements within one of the pixels,
an inter-element opposing surface is defined as a surface of the opposing substrate opposite the inter-element surface,
for at least one given pixel, a distance between the element surface and the element-opposing surface corresponding to each of the light-emitting elements of the given pixel is smaller than:
a distance between the inter-pixel surface and the inter-pixel opposing surface in an inter-pixel area between the given pixel and at least one neighboring pixel; and
a distance between the inter-element surface and the inter-element opposing surface corresponding to the light-emitting elements of the given pixel, and
on the element substrate, the distance between the given pixel and the neighboring pixel is greater than a distance between one of the light-emitting elements of the given pixel and a neighboring light-emitting element of the given pixel, and a distance between the inter-pixel surface and the inter-pixel opposing surface in an expansion is greater than a maximum distance between the inter-element surface and the inter-element opposing surface, the expansion being located between the given pixel and the neighboring pixel.

2. The display panel of claim 1, wherein
an element substrate reference surface is defined as a surface of the element substrate located on the inter-pixel area and nearest the opposing substrate,
the element substrate has primary recesses each located on one of the light-emitting elements and recessed with respect to the element substrate reference surface, a bottom of each primary concavity being the element surface and the element substrate reference surface being the inter-pixel surface,
an opposing substrate reference surface is defined as a surface of the opposing substrate opposite the element substrate reference surface, and
the opposing substrate has primary protrusions each located opposite one of the primary recesses and protruding from the opposing substrate reference surface, a top face of each primary protrusion being the element-opposing surface and the opposing substrate reference surface being the inter-pixel opposing surface.

3. The display panel of claim 1, wherein the light-emitting elements are formed between partition walls.

4. The display panel of claim 3, wherein the partition walls are of uniform height.

5. The display panel of claim 1, wherein an auxiliary electrode is provided between the pixels.

6. The display panel of claim 2, wherein the light-emitting elements of the pixels each emit a different color of light.

7. The display panel of claim 6, wherein the colors of light emitted by the light-emitting elements of the pixels are at least three in number.

8. The display panel of claim 1, wherein each one of the light-emitting elements is an electroluminescence light-emitting element.

9. The display panel of claim 6, wherein
the opposing substrate includes a plurality of color filters arrayed in correspondence with the different colors of light emitted by the light-emitting elements, and
the primary protrusions of the opposing substrate are the color filters.

10. The display panel of claim 9, wherein
the opposing substrate includes a black matrix partitioning the color filters in correspondence with the colors of light, and
the opposing substrate reference surface is a surface of the black matrix facing the element substrate.

11. The display panel of claim 1, wherein the expansion is located at an approximate midpoint of the inter-pixel area.

12. The display panel of claim 9, wherein the primary protrusions corresponding to the color filters each protrude with respect to the opposing substrate reference surface to a different degree, such that the distance between the element surface and the element-opposing surface is minimized at a middle light-emitting element for each of the pixels.

13. The display panel of claim 1, wherein for at least one given pixel, the distance between the element surface and the element-opposing surface corresponding to each of the light-emitting elements of the given pixel is greater than a distance between neighboring light-emitting elements of the given pixel.

* * * * *